(12) United States Patent
Clark

(10) Patent No.: US 10,966,033 B2
(45) Date of Patent: Mar. 30, 2021

(54) SYSTEMS AND METHODS FOR MODIFYING AN AUDIO SIGNAL USING CUSTOM PSYCHOACOUSTIC MODELS

(71) Applicant: Mimi Hearing Technologies GmbH, Berlin (DE)

(72) Inventor: Nicholas R. Clark, Royston (GB)

(73) Assignee: Mimi Hearing Technologies Gmbh, Berlin (DE)

( * ) Notice: Subject to any disclaimer, the term of this patent is extended or adjusted under 35 U.S.C. 154(b) by 0 days.

(21) Appl. No.: 16/538,541

(22) Filed: Aug. 12, 2019

(65) Prior Publication Data

US 2020/0029159 A1  Jan. 23, 2020

Related U.S. Application Data

(63) Continuation of application No. PCT/EP2019/069578, filed on Jul. 19, 2019, and a (Continued)

(30) Foreign Application Priority Data

Nov. 23, 2018 (EP) .................................... 18208020
Jul. 19, 2019 (EP) .................................... 19187377

(51) Int. Cl.
*H04R 3/02* (2006.01)
*H04R 25/00* (2006.01)
(Continued)

(52) U.S. Cl.
CPC ......... *H04R 25/505* (2013.01); *G10K 11/175* (2013.01); *H04R 5/04* (2013.01)

(58) Field of Classification Search
CPC ....... H04R 25/505; H04R 5/04; G10K 11/175
See application file for complete search history.

(56) References Cited

U.S. PATENT DOCUMENTS 6,327,366 B1  12/2001  Uvacek et al.
10,455,335 B1  10/2019  Clark
(Continued)

FOREIGN PATENT DOCUMENTS

WO  2018/069900 A1  4/2018

OTHER PUBLICATIONS

Plack, Christopher et al. "Estimates of compression at low and high frequencies using masking additivity in normal and impaired ears"; The Journal of the Acoustical Society of America; Jul. 2008; pp. 11.

*Primary Examiner* — Simon King
(74) *Attorney, Agent, or Firm* — Polsinelli PC

(57) ABSTRACT

Systems and methods are provided for modifying an audio signal using custom psychoacoustic models. A user's hearing profile is first obtained. Subsequently, an audio processing function is parameterized so as to optimize the user's perceptually relevant information. The method for calculating the user's perceptually relevant information comprises first processing audio signal samples using the parameterized processing function and then transforming samples of the processed audio signals into the frequency domain. Next, masking and hearing thresholds are obtained from the user's hearing profile and applied to the transformed audio sample, wherein the user's perceived data is calculated. Once perceptually relevant information is optimized, the resulting parameters are transferred to the audio processing function and an output audio signal is processed.

19 Claims, 22 Drawing Sheets

Related U.S. Application Data continuation-in-part of application No. 16/365,245, filed on Mar. 26, 2019, which is a continuation of application No. 16/206,376, filed on Nov. 30, 2018, now Pat. No. 10,455,335.

(60) Provisional application No. 62/721,417, filed on Aug. 22, 2018, provisional application No. 62/719,919, filed on Aug. 20, 2018, provisional application No. 62/701,350, filed on Jul. 20, 2018.

(51) Int. Cl.
    *H04R 5/04*     (2006.01)
    *G10K 11/175*     (2006.01)

(56) References Cited

U.S. PATENT DOCUMENTS

| | | |
|---|---|---|
| 10,687,155 B1 | 6/2020 | Clark et al. |
| 2003/0064746 A1 | 4/2003 | Rader et al. |
| 2008/0165980 A1 | 7/2008 | Pavlovic et al. |
| 2008/0182000 A1 | 7/2008 | Groff et al. |
| 2008/0212799 A1 | 9/2008 | Breitschadel |
| 2009/0083043 A1 | 3/2009 | Philippe et al. |
| 2011/0026724 A1* | 2/2011 | Doclo .................. H04R 1/1083 381/71.8 |
| 2011/0035212 A1* | 2/2011 | Briand ................ G10L 19/0204 704/203 |
| 2011/0137111 A1* | 6/2011 | Hanley ................ H04R 25/505 600/28 |
| 2012/0023051 A1* | 1/2012 | Pishehvar ............. G06N 3/049 706/21 |
| 2012/0183165 A1 | 7/2012 | Foo et al. |
| 2014/0309549 A1 | 10/2014 | Selig et al. |
| 2014/0314261 A1 | 10/2014 | Selig et al. |
| 2015/0078575 A1 | 3/2015 | Selig et al. |
| 2015/0281853 A1 | 10/2015 | Eisner et al. |
| 2017/0308909 A1 | 10/2017 | Faith et al. |
| 2019/0004767 A1 | 1/2019 | Aronson et al. |
| 2019/0347062 A1 | 11/2019 | Lyon |
| 2020/0029158 A1 | 1/2020 | Clark |
| 2020/0029159 A1 | 1/2020 | Clark |

\* cited by examiner

SYSTEMS AND METHODS FOR MODIFYING AN AUDIO SIGNAL USING CUSTOM PSYCHOACOUSTIC MODELS

CROSS-REFERENCE TO RELATED APPLICATIONS

This application is a continuation in part of U.S. application Ser. No. 16/365,245 filed Mar. 26, 2019, which claims priority to U.S. application Ser. No. 16/206,376 filed Nov. 30, 2018, which claims priority to European Application No. 18208020, filed Nov. 23, 2018, which claims priority to U.S. Provisional Application No. 62/701,350 filed Jul. 20, 2018, U.S. Provisional Application No. 62/719,919 filed Aug. 20, 2018, and U.S. Provisional Application No. 62/721,417 filed Aug. 22, 2018, and which are entirely incorporated by reference herein. This application claims priority to PCT Application No. PCT/EP2019/069578 and European Application No. 19187377.7, which are entirely incorporated by reference herein.

FIELD OF INVENTION

This invention relates generally to the field of audio engineering, psychoacoustics and digital signal processing—more specifically systems and methods for modifying an audio signal for replay on an audio device, for example for providing an improved listening experience on an audio device.

BACKGROUND

Perceptual coders work on the principle of exploiting perceptually relevant information ("PRI") to reduce the data rate of encoded audio material. Perceptually irrelevant information, information that would not be heard by an individual, is discarded in order to reduce data rate while maintaining listening quality of the encoded audio. These "lossy" perceptual audio encoders are based on a psychoacoustic model of an ideal listener, a "golden ears" standard of normal hearing. To this extent, audio files are intended to be encoded once, and then decoded using a decoder to make them suitable for consumption by all. Indeed, this paradigm forms the basis of MP3 encoding, and other similar encoding formats, which revolutionized music file sharing in the 1990's by significantly reducing audio file sizes, ultimately leading to the success of music streaming services today.

PRI estimation generally consists of transforming a sampled window of audio signal into the frequency domain, by for instance, using a fast Fourier transform. Masking thresholds are then obtained using psychoacoustic rules: critical band analysis is performed, noise-like or tone-like regions of the audio signal are determined, thresholding rules for the signal are applied and absolute hearing thresholds are subsequently accounted for. For instance, as part of this masking threshold process, quieter sounds within a similar frequency range to loud sounds are disregarded, as well as quieter sounds immediately following loud sounds within a similar frequency range. Additionally, sounds occurring below absolute hearing threshold are removed. Following this, the number of bits required to quantize the spectrum without introducing perceptible quantization error is determined. The result is approximately a ten-fold reduction in file size.

However, the "golden ears" standard, although appropriate for generic dissemination of audio information, fails to take into account the individual hearing capabilities of a listener. Indeed, there are clear, discernable trends of hearing loss with increasing age (see FIG. 1). Although hearing loss typically begins at higher frequencies, listeners who are aware that they have hearing loss do not typically complain about the absence of high frequency sounds. Instead, they report difficulties listening in a noisy environment and in perceiving details in a complex mixture of sounds. In essence, for hearing impaired (HI) individuals, intense sounds more readily mask information with energy at other frequencies—music that was once clear and rich in detail becomes muddled. As hearing deteriorates, the signal-conditioning capabilities of the ear begin to break down, and thus HI listeners need to expend more mental effort to make sense of sounds of interest in complex acoustic scenes (or miss the information entirely). A raised threshold in an audiogram is not merely a reduction in aural sensitivity, but a result of the malfunction of some deeper processes within the auditory system that have implications beyond the detection of faint sounds. To this extent, the perceptually-relevant information rate in bits/s, i.e. PRI, which is perceived by a listener with impaired hearing, is reduced relative to that of a normal hearing person due to higher thresholds and greater masking from other components of an audio signal within a given time frame.

However, PRI loss may be partially reversed through the use of digital signal processing (DSP) techniques that reduce masking within an audio signal, such as through the use of multiband compressive systems, commonly used in hearing aids. Moreover, these systems could be more accurately and efficiently parameterized according to the perceptual information transference to the HI listener—an improvement to the fitting techniques currently employed in sound augmentation/personalization algorithms.

Accordingly, it is the object of this invention to provide an improved listening experience on an audio device through better parameterized DSP.

SUMMARY

The problems raised in the known prior art will be at least partially solved in the invention as described below. The features according to the invention are specified within the independent claims, advantageous implementations of which will be shown in the dependent claims. The features of the claims can be combined in any technically meaningful way, and the explanations from the following specification as well as features from the figures which show additional embodiments of the invention can be considered.

A broad aspect of this disclosure is to employ PRI calculations based on custom psychoacoustic models to provide an improved listening experience on an audio device through better parameterized DSP, for more efficient lossy compression of an audio file according to a user's individual hearing profile, or dual optimization of both of these. By creating perceptual coders and optimally parameterized DSP algorithms using PRI calculations derived from custom psychoacoustic models, the presented technology improves lossy audio compression encoders as well as DSP fitting technology. In other words, by taking more of the hearing profile into account, a more effective initial fitting of the DSP algorithms to the user's hearing profile is obtained, requiring less of the cumbersome interactive subjective steps of the prior art. To this extent, the invention provides an improved listening experience on an audio device, optionally in combination with improved lossy compression of an audio file according to a user's individual hearing profile.

In general, the technology features systems and methods for modifying an audio signal using custom psychoacoustic models. The proposed approach is based on an iterative optimization approach using PRI as optimization criterion. PRI based on a specific user's individual hearing profile is calculated for a processed audio signal and the processing parameters are adapted, so as to optimize PRI. This process may be repeated in an iterative way. Eventually, the audio signal is processed with the optimal parameters determined by this optimization approach and a final representation of the audio signal generated that way. Since this final representation has an increased PRI for the specific user, his/her listening experience for the audio signal is improved. According to an aspect, a method for modifying an audio signal for replay on an audio device includes a) obtaining a user's hearing profile. In one embodiment, the user's hearing profile is derived from a suprathreshold test and a threshold test. The result of the suprathreshold test may be a psychophysical tuning curve and the threshold test may be an audiogram. In an additional embodiment, the hearing profile is derived from the result of a suprathreshold test, whose result may be a psychophysical tuning curve. In a further embodiment, an audiogram is calculated from a psychophysical tuning curve in order to construct a user's hearing profile. In embodiments, the hearing profile may be estimated from the user's demographic information, such as from the age and sex information of the user (see, ex. FIG. 1). The method further includes b) parameterizing a multi-band compression system so as to optimize the user's perceptually relevant information ("PRI"). In a preferred embodiment, the parameterizing of the multi-band compression system comprises the setup of at least two parameters per subband signal. In a preferred embodiment, the at least two parameters that are altered comprise the threshold and ratio values of each subband dynamic range compressor (DRC). The set of parameters may be determined for every frequency band in the auditory spectrum, corresponding to a channel. The frequency bands may be based on critical bands as defined by Zwicker [Zwicker, "Subdivision of the audible frequency range into critical bands," *Journal of the Acoustical Society of America*, Volume 33, Issue 2, p 248 (1961)]. The frequency bands may also be set in an arbitrary way. In another preferred embodiment, further parameters may be modified. These parameters comprise, but are not limited to: delay between envelope detection and gain application, integration time constants used in the sound energy envelope extraction phase of dynamic range compression, and static gain. More than one compressor can be used simultaneously to provide different parameterisation sets for different input intensity ranges. These compressors may be feedforward or feedback topologies, or interlinked variants of feedforward and feedback compressors.

The method of calculating the user's PRI following processing may include i) processing audio signal samples using the parameterized multi-band compression system, ii) transforming samples of the processed audio signals into the frequency domain, iii) obtaining hearing and masking thresholds from the user's hearing profile, iv) applying masking and hearing thresholds to the transformed audio sample and calculating user's perceived data.

Following optimized parameterization, the method may further include c) transferring the obtained parameters to a processor and finally, d) processing with the processor an output audio signal.

The method of optimized parameterization may further include the use of ambient noise signal within PRI calculation. Additionally, the method of optimized parameterization may be constrained by at least one of spectral coloration and distortion.

In one embodiment, the method of optimized parameterization may apply different weightings to perceptual entropy contributions from different frequency regions before summing to an overall perceptual entropy measure. In a further embodiment, perceptually relevant information is calculated by specific loudness.

In a preferred embodiment, an output audio device for playback of the audio signal is selected from a list that may include: a mobile phone, a computer, a television, an embedded audio device, a pair of headphones, a hearing aid or a speaker system.

Configured as above, the proposed method has the advantage and technical effect of providing improved parameterization of DSP algorithms and, consequently, an improved listening experience for users. This is achieved through optimization of PRI calculated from custom psychoacoustic models.

According to another aspect, a method for modifying an audio signal for encoding an audio file is disclosed, wherein the audio signal has been first processed by the preceding optimized multiband compression system. The method includes obtaining a user's hearing profile. In one embodiment, the user's hearing profile is derived from a suprathreshold test and a threshold test. The result of the suprathreshold test may be a psychophysical tuning curve and the threshold test may be an audiogram. In an additional embodiment, the hearing profile is solely derived from a suprathreshold test, which may be a psychophysical tuning curve. In this embodiment, an audiogram is calculated from the psychophysical tuning curve in order to construct a user's hearing profile. In an additional embodiment, the hearing profile may be estimated from the user's demographic information, such as from the age and sex information of the user. The method further includes splitting a portion of the audio signal into frequency components e.g. by transforming a sample of the audio signal into the frequency domain, c) obtaining masking thresholds from the user's hearing profile, d) obtaining hearing thresholds from the user's hearing profile, e) applying masking and hearing thresholds to the frequency components and disregarding user's imperceptible audio signal data, f) quantizing the audio sample, and finally g) encoding the processed audio sample. Alternatively, the signal can be spectrally decomposed using a bank of bandpass filters and the frequency components of the signal determined in this way.

Configured as above, the proposed method has the advantage and technical effect of providing more efficient perceptual coding while also improving the listening experience for a user. This is achieved by using custom psychoacoustic models that allow for enhanced compression by removal of additional irrelevant audio information as well as through the optimization of a user's PRI for the better parameterization of DSP algorithms.

According to another aspect, a method for processing an audio signal based on a parameterized digital signal processing function is disclosed, the processing function operating on subband signals of the audio signal and the parameters of the processing function comprise at least one parameter per subband. The method comprises: determining the parameters of the processing function based on an optimization of a user's PRI for the audio signal; parameterizing the processing function with the determined parameters; and processing the audio signal by applying the parameterized processing function. The calculation of the user's PRI for the audio signal may be based on a hearing profile of the user comprising masking thresholds and hearing thresholds for the user. The processing function is then configured using the determined parameters. As already mentioned, the parameters of the processing function are determined by the optimization of the PRI for the audio signal. Any kind of multidimensional optimization technique may be employed for this purpose. For example, a linear search on a search grid for the parameters may be used to find a combination of parameters that maximize the PRI. The parameter search may be performed in iterations of reduced step sizes to search a finer search grid after having identified an initial coarse solution. By selecting the parameters of the processing function so as to optimize the user's PRI for the audio signal that is to be processed, the listening experience of the user is enhanced. For example, the intelligibility of the audio signal is improved by taking into account the user's hearing characteristics when processing the audio signal, thereby at least partially compensating the user's hearing loss. The processed audio signal may be played back to the user, stored or transmitted to a receiving device.

The user's hearing profile may be derived from at least one of a suprathreshold test, a psychophysical tuning curve, a threshold test and an audiogram as disclosed above. The user's hearing profile may also be estimated from the user's demographic information. The user's masking thresholds and hearing thresholds from his/her hearing profile may be applied to the frequency components of the audio signal, or to the audio signal in the transform domain. The PRI may be calculated from the information within the audio signal that is perceptually relevant to the user.

The processing function may operate on a subband basis, i.e. operating independently on a plurality of frequency bands. For example, the processing function may apply a signal processing function in each frequency subband. The applied signal processing functions for the subbands may be different for each subband. For example, the signal processing functions may be parametrized and separate parameters determined for each subband. For this purpose, the audio signal may be transformed into a frequency domain where signal frequency components are grouped into the subbands, which may be physiologically motivated and defined such as according to the critical band (Bark) scale. Alternatively, a bank of time domain filters may be used to split the signal into frequency components. For example, a multiband compression of the audio signal is performed and the parameters of the processing function comprise at least one of a threshold, a ratio, and a gain in each subband. In embodiments, the processing function itself may have a different topology in each frequency band. For example, a simpler compression architecture may be employed at very low and very high frequencies, and more complex and computationally expensive topologies may be reserved for the frequency ranges where humans are most sensitive to subtleties.

The determining of the processing parameters may comprise a sequential determination of subsets of the processing parameters, each subset determined so as to optimize the user's PRI for the audio signal. In other words, only a subset of the processing parameters is considered at the same time during the optimization. Other parameters are then taken into account in further optimization steps. This reduces the dimensionality for the optimization procedure and allows faster optimization and/or usage of simpler optimization algorithms such as brute force search to determine the parameters. For example, the processing parameters are determined sequentially on a subband by subband basis.

In a first broad aspect, the selection of a subset of the subbands for parameter optimization may be such that a masking interaction between the selected subbands is minimized. The optimization may then determine the processing parameters for the selected subbands. Since there is no or only little masking interaction amongst the selected subbands of the subset, optimization of parameters can be performed separately for the selected subbands. For example, subbands largely separated in frequency typically have little masking interaction and can be optimized individually.

The method may further comprise determining the at least one processing parameter for an unselected subband based on the processing parameters of adjacent subbands that have previously been determined. For example, the at least one processing parameter for an unselected subband is determined based on an interpolation of the corresponding processing parameters of the adjacent subbands. Thus, it is not necessary to determine the parameters of all subbands by the optimization method, which may be computationally expensive and time consuming. One could, for example, perform parameter optimization for every other subband and then interpolate the parameters of the missing subbands from the parameters of the adjacent subbands.

In a second broad aspect, the selection of subbands for parameter optimization may be as follows: first selecting a subset of adjacent subbands; tying the corresponding values of the at least one parameter for the selected subbands; and then performing a joint determination of the tied parameter values by maximizing the user's PRI for the selected subbands. For example, a number n of adjacent subbands is selected and the parameters of the selected subbands tied. For example, only a single compression threshold and a single compression ratio are considered for the subset, and the user's PRI for the selected subbands is maximized by searching for the best threshold and gain values.

The method may continue by selecting a reduced subset of adjacent subbands from the selected initial subset of subbands and tying the corresponding values of the at least one parameter for the reduced subset of subbands. For example, the subbands at the edges of the initial subset as determined above are dropped, resulting in a reduced subset with a smaller number n−2 of subbands. A joint determination of the tied parameters is performed by maximizing the user's PRI for the reduced subset of subbands. This will provide a new solution for the tied parameters of the reduced subset, e.g. a threshold and a ratio for the subbands of the reduced subset. The new parameter optimization for the reduced subset may be based on the results of the previous optimization for the initial subset. For example, when performing the parameter optimization for the reduced subset, the solution parameters from the previous optimization for the initial subset may be used as a starting point for the new optimization. The previous steps may be repeated and the subsets subsequently reduced until a single subband remains and is selected. The optimization may then continue with determining the at least one parameter of the single subband. Again, this last optimization step may be based on the previous optimization results, e.g. by using the previously determined parameters as a starting point for the final optimization. Of course, the above processing steps are applied on a parameter by parameter basis, i.e. operating separately on thresholds, ratios, gains, etc.

In embodiments, the optimization method starts again with another subset of adjacent subbands and repeats the previous steps of determining the at least one parameter of a single subband by successively reducing the selected another initial subset of adjacent subbands. When only a single subband remains as a result of the continued reduction of subbands in the selected subsets, the parameters determined for the single subband derived from the initial subset and the single subband derived from the another initial subset are jointly processed to determine the parameters of the single subband derived from the initial subset and/or the parameters of the single subband derived from the another initial subset. The joint processing of the parameters for the derived single subbands may comprise at least one of: joint optimization of the parameters for the derived single subbands; smoothing of the parameters for the derived single subbands; and applying constraints on the deviation of corresponding values of the parameters for the derived single subbands. Thus, the parameters of the single subband derived from the initial subset and the parameters of the single subband derived from the another initial subset can be made to comply with given conditions such as limiting their distances or deviations to ensure a smooth contour or course of the parameters across the subbands. Again, the above processing steps are applied on a parameter by parameter basis, i.e. operating separately on thresholds, ratios, gains, etc.

The above audio processing method may be followed by an audio encoding method that employs the user's hearing profile. The audio processing method may therefore comprise: splitting a portion of the audio signal into frequency components, e.g. by transforming a sample of audio signal into the frequency domain, obtaining masking thresholds from the user's hearing profile, obtaining hearing thresholds from the user's hearing profile, applying masking and hearing thresholds to the frequency components and disregarding user's imperceptible audio signal data, quantizing the audio sample, and encoding the processed audio sample.

Unless otherwise defined, all technical terms used herein have the same meaning as commonly understood by one of ordinary skill in the art to which this technology belongs.

The term "audio device", as used herein, is defined as any device that outputs audio, including, but not limited to: mobile phones, computers, televisions, hearing aids, headphones and/or speaker systems.

The term "hearing profile", as used herein, is defined as an individual's hearing data attained, by example, through: administration of a hearing test or tests, from a previously administered hearing test or tests attained from a server or from a user's device, or from an individual's sociodemographic information, such as from their age and sex, potentially in combination with personal test data. The hearing profile may be in the form of an audiogram and/or from a suprathreshold test, such as a psychophysical tuning curve.

The term "masking thresholds", as used herein, is the intensity of a sound required to make that sound audible in the presence of a masking sound. Masking may occur before onset of the masker (backward masking), but more significantly, occurs simultaneously (simultaneous masking) or following the occurrence of a masking signal (forward masking). Masking thresholds depend on the type of masker (e.g. tonal or noise), the kind of sound being masked (e.g. tonal or noise) and on the frequency. For example, noise more effectively masks a tone than a tone masks a noise. Additionally, masking is most effective within the same critical band, i.e. between two sounds close in frequency. Individuals with sensorineural hearing impairment typically display wider, more elevated masking thresholds relative to normal hearing individuals. To this extent, a wider frequency range of off-frequency sounds will mask a given sound. Masking thresholds may be described as a function in the form of a masking contour. A masking contour is typically a function of the effectiveness of a masker in terms of intensity required to mask a signal, or probe tone, versus the frequency difference between the masker and the signal or probe tone. A masking contour is a representation of the user's cochlear spectral resolution for a given frequency, i.e. place along the cochlear partition. It can be determined by a behavioral test of cochlear tuning rather than a direct measure of cochlear activity using laser interferometry of cochlear motion. A masking contour may also be referred to as a psychophysical or psychoacoustic tuning curve (PTC). Such a curve may be derived from one of a number of types of tests: for example, it may be the results of Brian Moore's fast PTC, of Patterson's notched noise method or any similar PTC methodology. Other methods may be used to measure masking thresholds, such as through an inverted PTC paradigm, wherein a masking probe is fixed at a given frequency and a tone probe is swept through the audible frequency range.

The term "hearing thresholds", as used herein, is the minimum sound level of a pure tone that an individual can hear with no other sound present. This is also known as the 'absolute threshold' of hearing. Individuals with sensorineural hearing impairment typically display elevated hearing thresholds relative to normal hearing individuals. Absolute thresholds are typically displayed in the form of an audiogram.

The term "masking threshold curve", as used herein, represents the combination of a user's masking contour and a user's absolute thresholds.

The term "perceptually relevant information" or "PRI", as used herein, is a general measure of the information rate that can be transferred to a receiver for a given piece of audio content after taking into consideration what information will be inaudible due to having amplitudes below the hearing threshold of the listener, or due to masking from other components of the signal. The PRI information rate can be described in units of bits per second (bits/s).

The term "multi-band compression system", as used herein, generally refers to any processing system that spectrally decomposes an incoming audio signal and processes each subband signal separately. Different multi-band compression configurations may be possible, including, but not limited to: those found in simple hearing aid algorithms, those that include feed forward and feed back compressors within each subband signal (see e.g. commonly owned European Patent Application 18178873.8), and/or those that feature parallel compression (wet/dry mixing).

The term "threshold parameter", as used herein, generally refers to the level, typically decibels relative to Full Scale (dB FS) above which compression is applied in a DRC.

The term "ratio parameter", as used herein, generally refers to the gain (if the ratio is larger than 1), or attenuation (if the ratio is a fraction comprised between zero and one) per decibel exceeding the compression threshold. In a preferred embodiment of the present invention, the ratio is a fraction comprised between zero and one.

The term "imperceptible audio data", as used herein, generally refers to any audio information an individual cannot perceive, such as audio content with amplitude below hearing and masking thresholds. Due to raised hearing thresholds and broader masking curves, individuals with sensorineural hearing impairment typically cannot perceive as much relevant audio information within a complex audio signal as a normal hearing individual. In this instance, perceptually relevant information is reduced.

The term "quantization", as used herein, refers to representing a waveform with discrete, finite values. Common quantization resolutions are 8-bit (256 levels), 16-bit (65,536 levels) and 24 bit (16.8 million levels). Higher quantization resolutions lead to less quantization error, at the expense of file size and/or data rate.

The term "frequency domain transformation", as used herein, refers to the transformation of an audio signal from the time domain to the frequency domain, where component frequencies are distributed across the frequency spectrum. For example, a Fourier transform converts the time domain signal into an integral of sine waves of different frequencies, each of which represents a different frequency component.

The phrase "computer readable storage medium", as used herein, is defined as a solid, non-transitory storage medium. It may also be a physical storage place in a server accessible by a user, e.g. to download for installation of the computer program on her device or for cloud computing.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only example embodiments of the disclosure and are not therefore to be considered to be limiting of its scope, the principles herein are described and explained with additional specificity and detail through the use of the accompanying drawings in which.

DETAILED DESCRIPTION

Figure 1A:
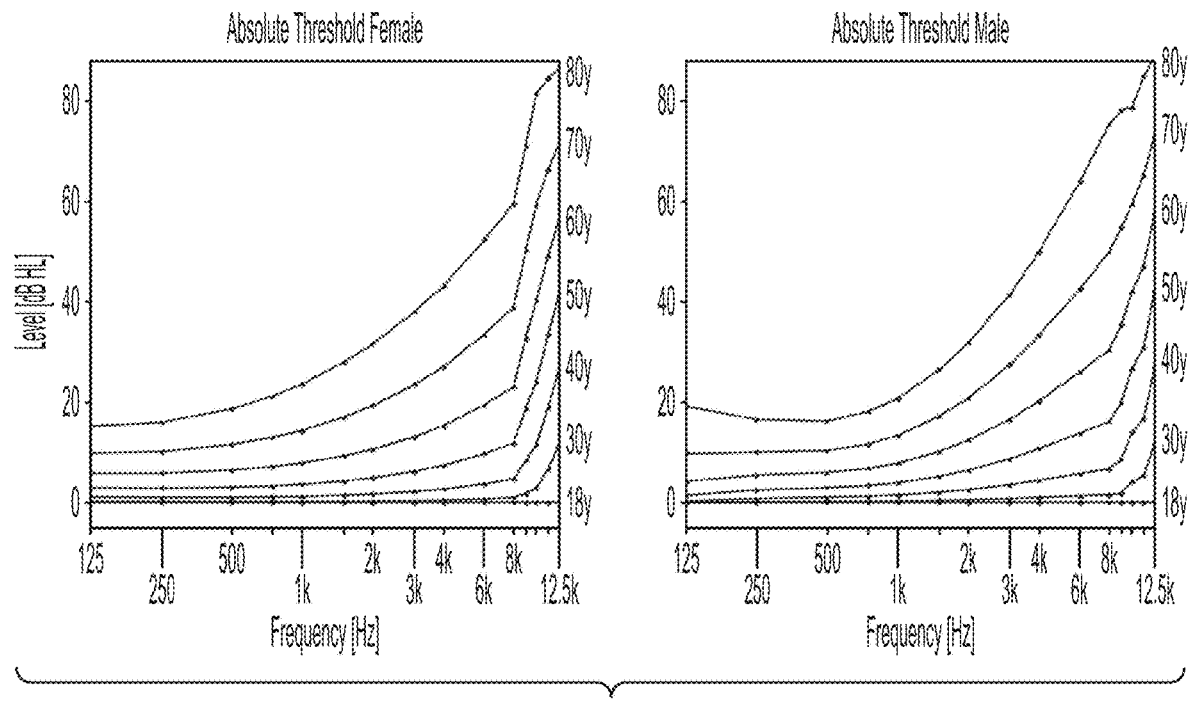
FIG. 1A illustrates representative absolute hearing thresholds by age group and sex in which increasing hearing loss is apparent with advancing age.

Various example embodiments of the disclosure are discussed in detail below. While specific implementations are discussed, it should be understood that these are described for illustration purposes only. A person skilled in the relevant art will recognize that other components and configurations may be used without parting from the spirit and scope of the disclosure.

The present invention relates to creating improved lossy compression encoders as well as improved parameterized audio signal processing methods using custom psychoacoustic models. Perceptually relevant information ("PRI") is the audio information that is perceived by a listener for a given piece of audio content after factoring in what information will be lost due to being below the hearing threshold of the listener, or due to masking from other components of the signal within a given time frame. This is the result of a sequence of signal processing steps that are well defined for the ideal listener. In general terms, PRI is calculated from absolute thresholds of hearing (the minimum sound intensity at a particular frequency that a person is able to detect) as well as the masking patterns for the individual.

Masking is a phenomenon that occurs across all sensory modalities where one stimulus component prevents detection of another. The effects of masking are present in the typical day-to-day hearing experience as individuals are rarely in a situation of complete silence with just a single pure tone occupying the sonic environment. The basilar membrane running along the center of the cochlea, which interfaces with the structures responsible for neural encoding of mechanical vibrations, is frequency selective. To this extent, the basilar membrane acts to spectrally decompose incoming sonic information whereby energy concentrated in different frequency regions is represented to the brain along different auditory fibers. It can be modelled as a filter bank with near logarithmic spacing of filter bands. This allows a listener to extract information from one frequency band, even if there is strong simultaneous energy occurring in a remote frequency region. For example, an individual will be able to hear both the low-frequency rumble of a car approaching whilst listening to someone speak at a higher frequency. High energy maskers are required to mask signals when the masker and signal have different frequency content, but low intensity maskers can mask signals when their frequency content is similar.

The characteristics of auditory filters can be measured, for example, by playing a continuous tone at the center frequency of the filter of interest, and then measuring the masker intensity required to render the probe tone inaudible as a function of relative frequency difference between masker and probe components. A psychophysical tuning curve (PTC), consisting of a frequency selectivity contour extracted via behavioral testing, provides useful data to determine an individual's masking contours. In one embodiment of the test, a masking band of noise is gradually swept across frequency, from below the probe frequency to above the probe frequency. The user then responds when they can hear the probe and stops responding when they no longer hear the probe. This gives a jagged trace that can then be interpolated to estimate the underlying characteristics of the auditory filter. Other methodologies known in the prior art may be employed to attain user masking contour curves. For instance, an inverse paradigm may be used in which a probe tone is swept across frequency while a masking band of noise is fixed at a center frequency (known as a "masking threshold test" or "MT test").

Figure 1B:
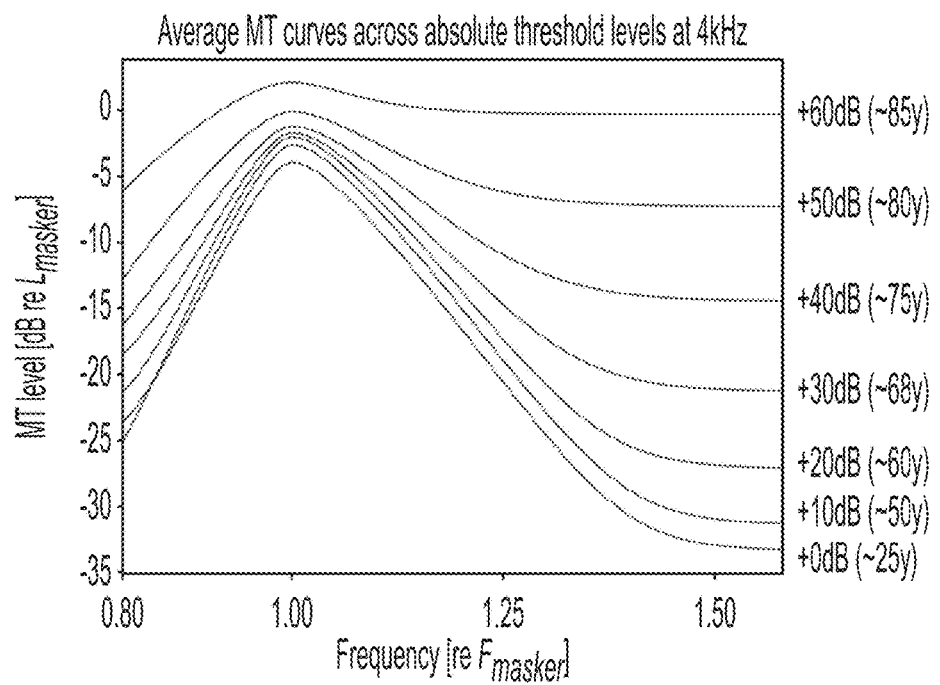
FIG. 1B illustrates a series of masked threshold curves which show a marked broadening based on age.

Patterns begin to emerge when testing listeners with different hearing capabilities using the MT test. Hearing impaired listeners have broader MT curves, meaning maskers at remote frequencies are more effective. To this extent, each auditory nerve fiber of the HI listener contains information from neighboring frequency bands, resulting in increasing off-frequency masking. When MT curves are segmented by listener age, which is highly correlated with hearing loss as defined by PTT data (FIG. 1A), there is a clear trend of the broadening of MT curves with age, FIG. 1B.

Figure 2:
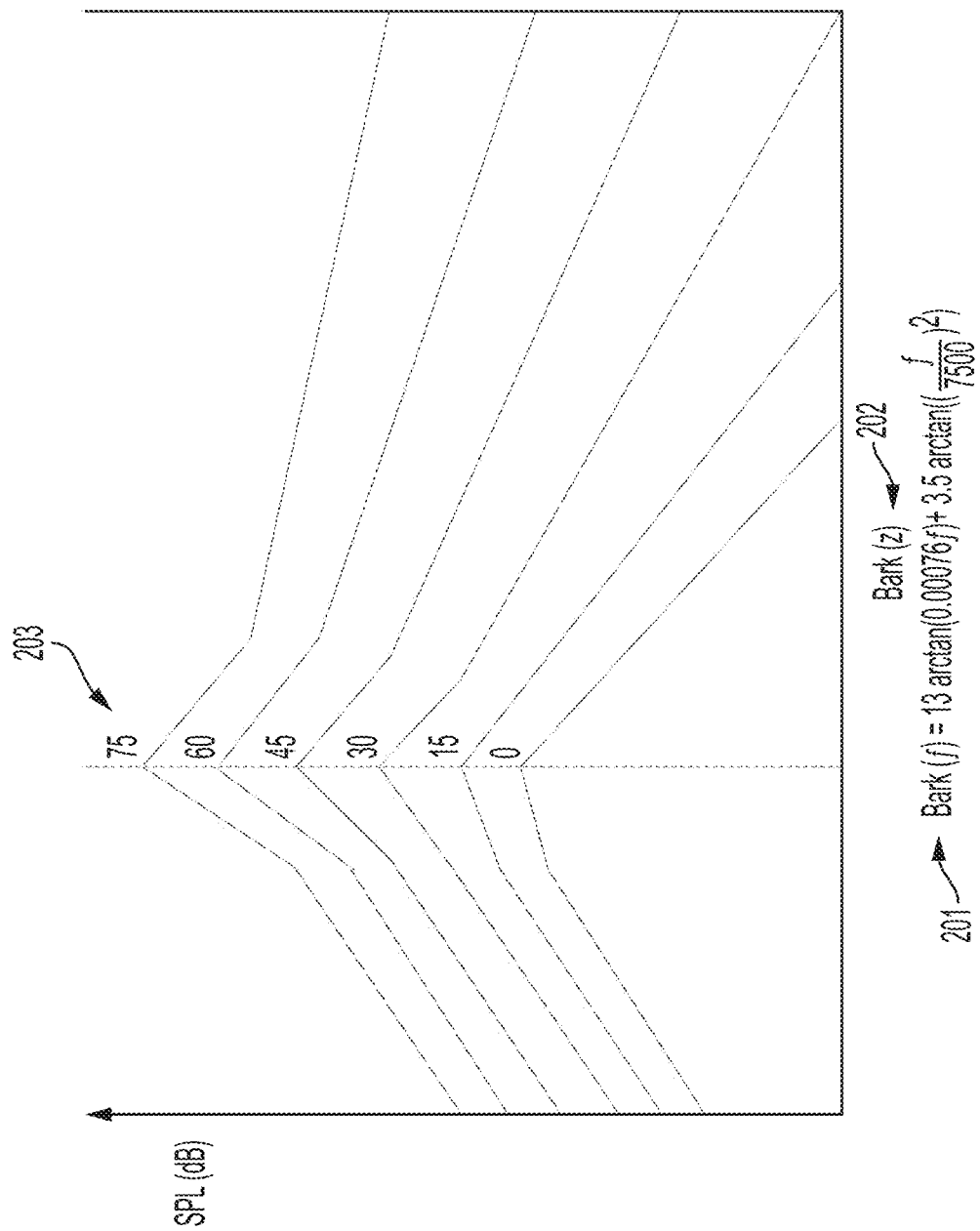
FIG. 2 illustrates a collection of prototype masking functions for a single-tone masker shown with level as a parameter.

FIG. 2 shows example masking functions for a sinusoidal masker with sound level as the parameter 203. Frequency here is expressed according to the Bark scale, 201, 202, which is a psychoacoustical frequency scale in which the critical bands of human hearing each have a width of one Bark. A critical band is a band of audio frequencies within which a second tone will interfere with the perception of the first tone by auditory masking. For the purposes of masking, a Bark frequency scale provides a more linear visualization of spreading functions. As illustrated, the higher the sound level of the masker, the greater the amount of masking occurs across a broader expanse of frequency bands.

Figure 3:
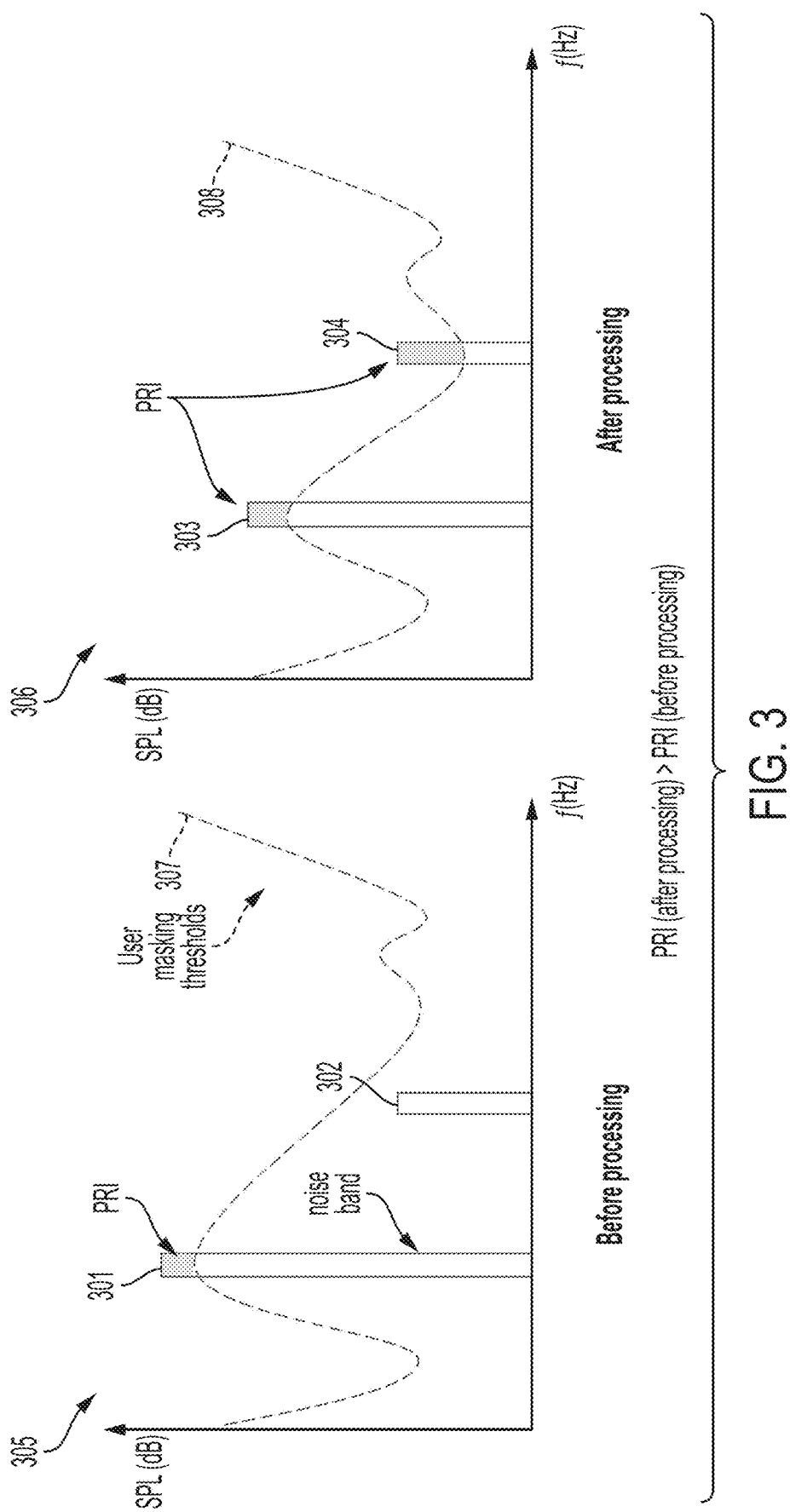
FIG. 3 illustrates an example of a simple, transformed audio signal in which compression of a masking noise band leads to an increase in PRI.

FIG. 3 shows a sample of a simple, transformed audio signal consisting of two narrow bands of noise, 301 and 302. In the first instance 305, signal 301 masks signal 302, via masking threshold curve 307, rendering signal 302 perceptually inaudible. In the second instance 306, signal component 303 is compressed, reducing its signal strength to such an extent that signal 304 is unmasked. The net result is an increase in PRI, as represented by the shaded area 303, 304 above the modified user masking threshold curve, 308.

Figure 4:
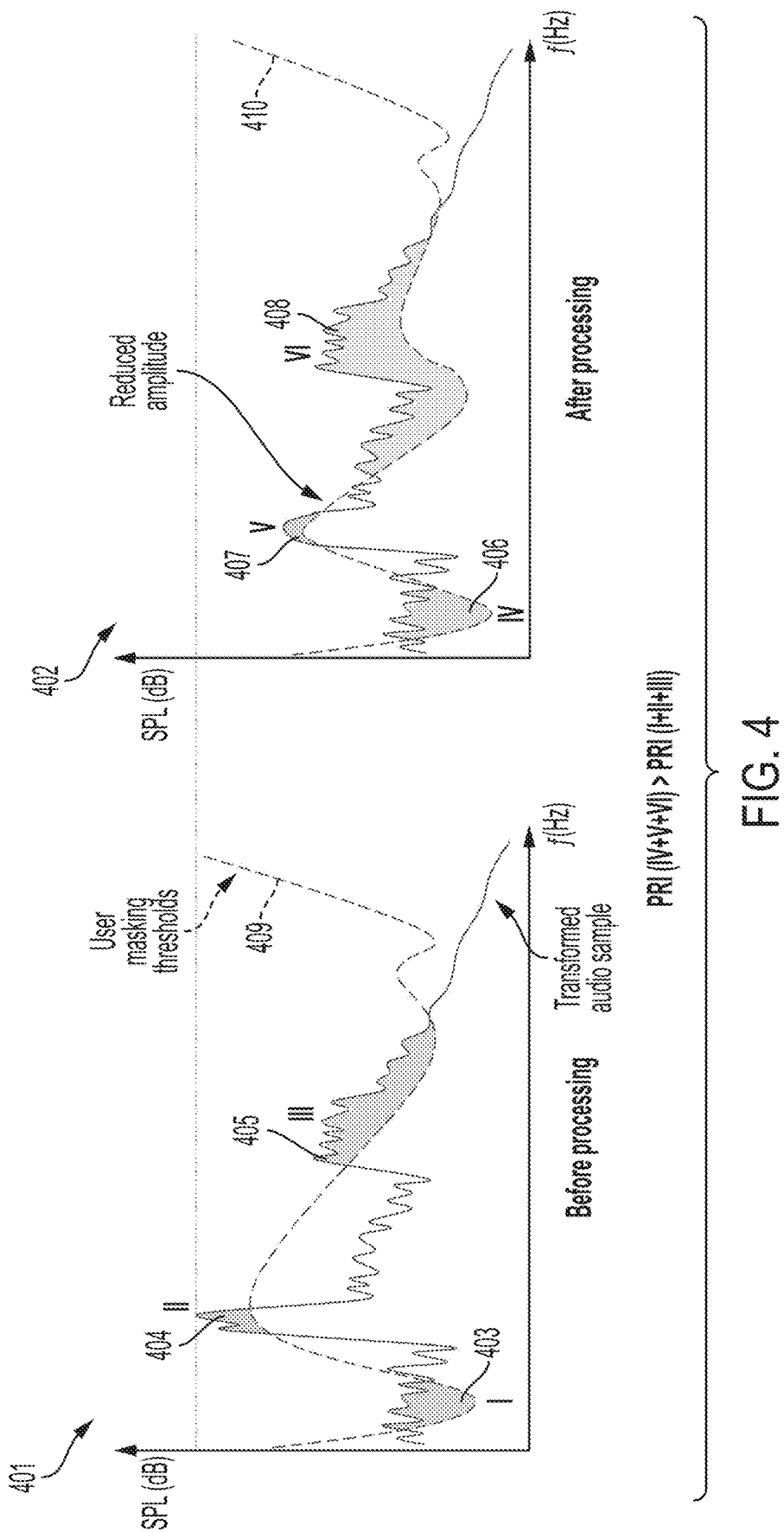
FIG. 4 illustrates an example of a more complex, transformed audio signal in which compression of a signal masker leads to an increase in PRI.
Figure 5:
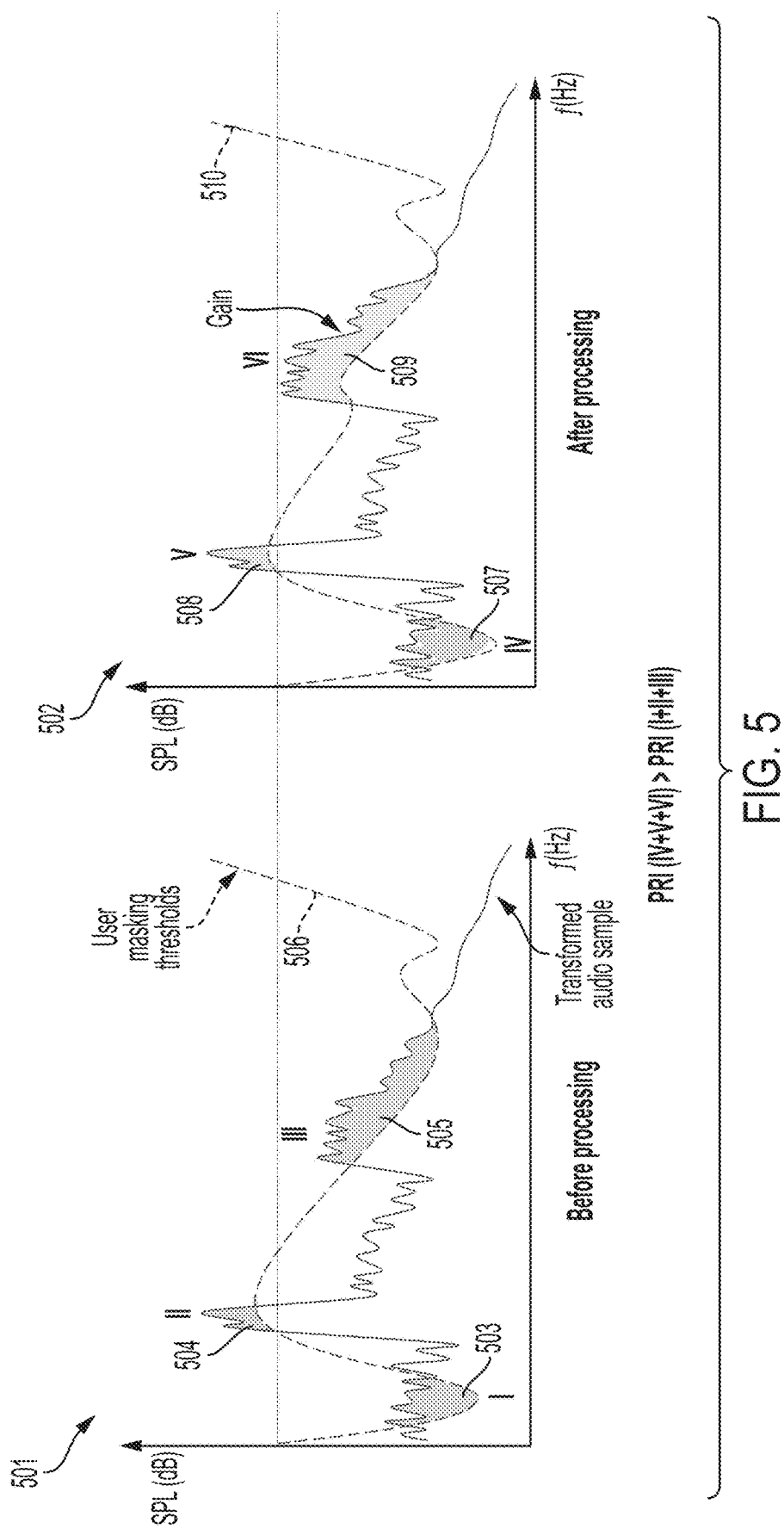
FIG. 5 illustrates an example of a complex, transformed audio signal in which increasing gain for an audio signal leads to an increase in PRI.
Figure 6:
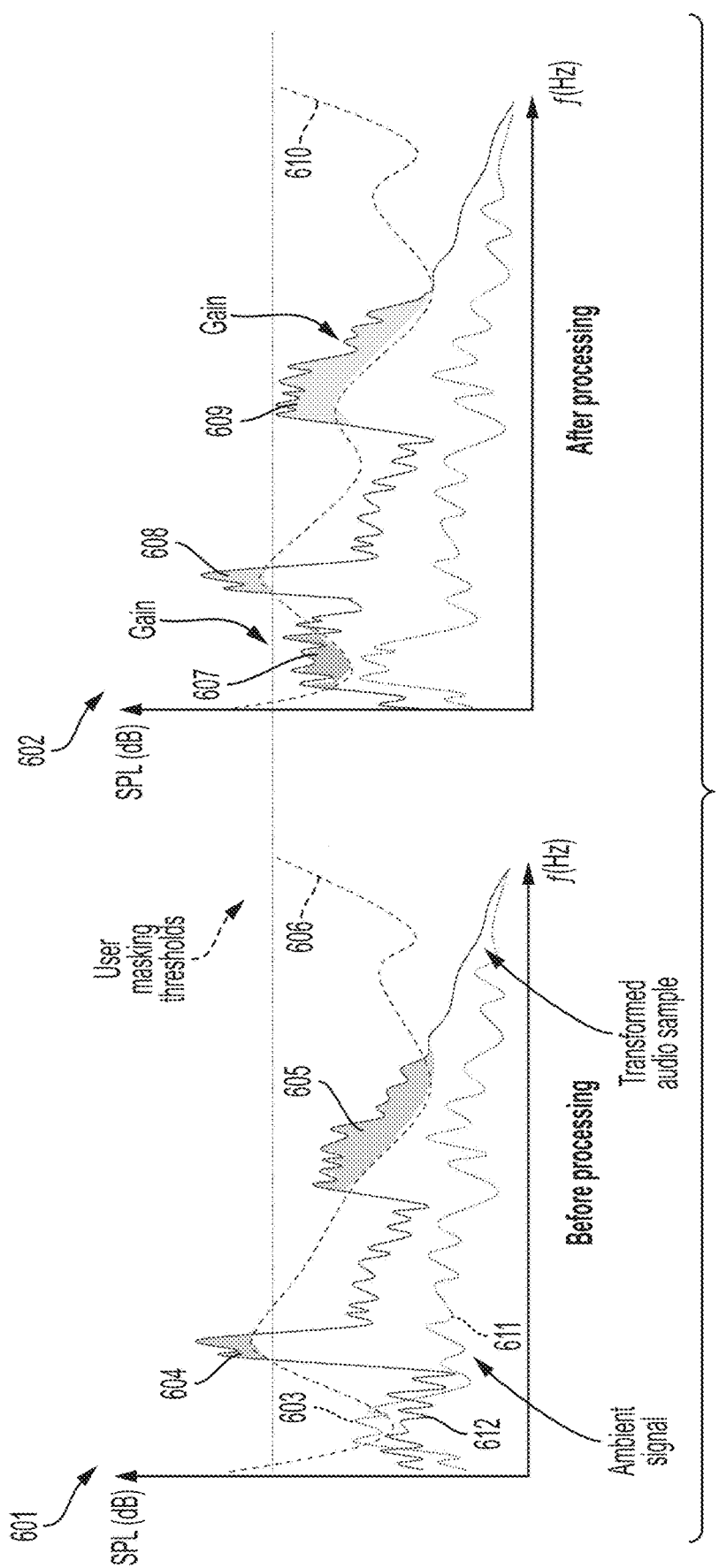
FIG. 6 illustrates an example of a complex, transformed audio signal—along with a transformed ambient noise signal—in which increasing gain for an audio signal leads to an increase in PRI.

FIGS. 4 and 5 show a sample of a more complex, transformed audio signal. In audio sample 401, masking signal 404 masks much of audio signal 405, via masking threshold curve 409. Through compression of signal component 404 in audio sample 402, the masking threshold curve 410 changes and PRI increases, as represented by shaded areas 406-408 above the user making threshold curve, 410. Thus, the user's listening experience improves. Similarly, PRI may also be increased through the application of gain in specific frequency regions, as illustrated in FIG. 5. Through the application of gain to signal component 505, signal component 509 increases in amplitude relative to masking threshold curve 510, thus increasing user PRI. FIG. 6 shows a sample of a transformed audio signal together with a transformed ambient signal 611. Here, ambient masking signal 603 masks audio signal 612. Through the application of gain to the audio signal, for example, signal component 607 increases in amplitude relative to masking threshold curve 610, thus increasing user PRI. The additional of an ambient signal (i.e. ambient noise) may be considered as a modification of the absolute threshold curve within a hearing profile, and thus lend itself easily to use in PRI parameter optimization, The above explanations are presented to visualize the effects of sound augmentation DSP. In general, sound augmentation DSP modifies signal levels in a frequency selective manner, e.g. by applying gain or compression to sound components to achieve the above mentioned effects (other DSP processing that has the same effect is possible as well). For example, the signal levels of high power (masking) sounds (frequency components) are decreased through compression to thereby reduce the masking effects caused by these sounds, and the signal levels of other signal components are selectively raised (by applying gain) above the hearing thresholds of the listener.

PRI can be calculated according to a variety of methods found in the prior art. One such method, also called perceptual entropy, was developed by James D. Johnston at Bell Labs [J. D. Johnston, "Estimation of Perceptual Entropy Using Noise Masking Criteria," Proc. Int. Conf. Audio Speech Signal Proc. (ICASSP), pp 2524-2527 (1988)], generally comprising: transforming a sampled window of audio signal into the frequency domain, obtaining masking thresholds using psychoacoustic rules by performing critical band analysis, determining noise-like or tone-like regions of the audio signal, applying thresholding rules for the signal and then accounting for absolute hearing thresholds. Following this, the number of bits required to quantize the spectrum without introducing perceptible quantization error is determined. For instance, Painter & Spanias disclose the following formulation for perceptual entropy in units of bits [Painter & Spanias, *Perceptual Coding of Digital Audio*, Proc. Of IEEE, Vol. 88, No. 4 (2000)]

$$PE = \sum_{i=1}^{25} \sum_{w=bl_i}^{bh_i} \log_2\left(2\left|nint\left(\frac{\Re(\omega)}{\sqrt{6T_i/k_i}}\right)\right|+1\right) + \log_2\left(2\left|nint\left(\frac{\Im(\omega)}{\sqrt{6T_i/k_i}}\right)\right|+1\right)$$

Where:
i=critical band index;
$bl_i$ and $bh_i$=upper and lower transform coefficient bounds of band i;
$k_i$=number of transform coefficients in band i;
$T_i$=masking threshold in band i;
nint=rounding to the nearest integer
$\Re(\omega)$=real transform spectral coefficients
$\Im(\omega)$=imaginary transform spectral coefficients.

One way of using a PRI measure of perceptual entropy to optimize a processor to compensate for hearing impairment would be to maximize the perceptual entropy of the processed signal. In general the standard expression for perceptual entropy shown above results in an overall PRI measure where contributions from different frequency regions are heavily weighted towards higher frequencies.

It is also possible to use a modified weighted perceptual entropy measure $PE_w$, where PE contributions from different frequency bands are weighted differently, so as to result in a more even distribution of PE contributions across frequency for example. If overall PE is the sum of contributions $PE_i$ from individual frequency bands:

$$PE = \Sigma PE_i$$

then a weighted perceptual entropy measure $PE_w$ applies different band weights $w_i$ to individual band contributions:

$$PE_w = \Sigma w_i PE_i.$$

It can be observed experimentally that to a first-order approximation unweighted perceptual entropy tends to be evenly distributed on a linear transform-bin-based frequency scale, hence a simple weighting function intended to achieve an even distribution on a banded frequency scale sets each band weight to be inversely proportional to the number of linear transform bins included within each bark band.

Another approach to calculating PRI is to use a measure of specific loudness $L_i$ in each critical band, where a summation of specific loudness across all critical bands computes the overall loudness L of the signal:

$$L = \Sigma L_i$$

A simple approach to calculating $L_i$ and hence L is provided by Schroeder et al. [M. Schroeder, B. S. Atal, and J. L. Hall, "Optimizing Digital Speech Coders by Exploiting Masking Properties of the Human Ear," *J. Acoust. Soc. Amer.*, pp. 1647-1652 (1979 December).]:

$$L = C\Sigma \max([E_i - T_i]^\gamma, 0)$$

where:
$E_i$=the spread energy (power) spectrum level in band i
$T_i$=combined masking and hearing threshold in band i
$\gamma$=loudness exponent ~0.25
C=calibration constant required to output a loudness of 1 sone for a 1 kHz sinusoidal input at 40 dB SPL.

$E_i$ and $T_i$ can be derived from a hearing profile of an individual listener, so that banded specific loudness values $L_i$ are determined by the hearing profile for each frame of a processed signal. By comparing the banded specific loudness values $L_i$ for a hearing impaired listener with those of a healthy listener reference, a PRI measure of specific loudness for a corpus of training signals can be used to optimize processor parameters to compensate for hearing impairment.

Using a PRI measure of specific loudness to optimize a processor to compensate for hearing impairment differs conceptually from using a PRI measure of perceptual entropy in that the optimization would not aim to maximize loudness, rather the aim is to match the banded specific loudness values $L_i$ for a hearing impaired listener with those of the healthy listener reference. This can be done by calculating banded loudness error values as the difference in $L_i$ for the hearing impaired listener and $L_i$ for the healthy listener reference, and then for example optimizing processor parameters in order to minimize the modulus sum of the banded error loudness values.

Figure 7:
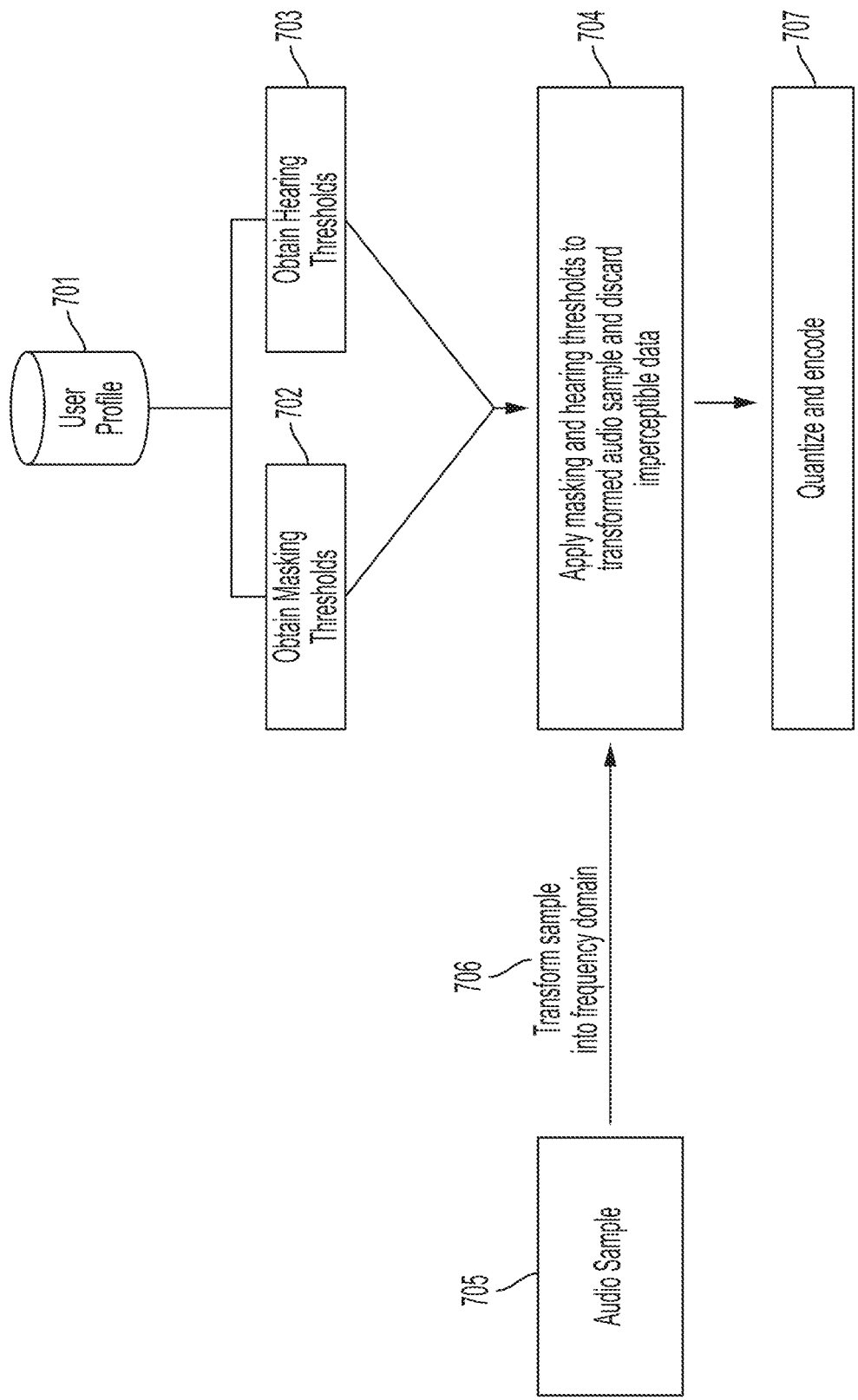
FIG. 7 illustrates a flow chart detailing perceptual encoding according to an individual hearing profile.

FIG. 7 illustrates the process by which an audio sample may be perceptually encoded according to an individual's hearing profile. First a hearing profile 601 is attained and individual masking 702 and hearing thresholds 703 are determined. Hearing thresholds may readily be determined from audiogram data. Masking thresholds may also readily be determined from masking threshold curves, as discussed above. Hearing thresholds may additionally be attained from results from masking threshold curves (as described in commonly owned EP17171413.2, entitled "Method for accurately estimating a pure tone threshold using an unreferenced audio-system"). Subsequently, masking and hearing thresholds are applied 704 to the transformed audio sample 705, 7606 that is to be encoded, and perceptually irrelevant information is discarded. The transformed audio sample is then quantized and encoded 707. To this extent, the encoder uses an individualized psychoacoustic profile in the process of perceptual noise shaping leading to bit reduction by allowing the maximum undetectable quantization noise. This process has several applications in reducing the cost of data transmission and storage.

One application is in digital telephony. Two parties want to make a call. Each handset (or data tower to which the handset is connected) makes a connection to a database containing the psychoacoustic profile of the other party (or retrieves it directly from the other handset during the handshake procedure at the initiation of the call). Each handset (or data tower/server endpoint) can then optimally reduce the data rate for their target recipient. This would result in power and data bandwidth savings for carriers, and a reduced data drop-out rate for the end consumers without any impact on quality.

Another application is personalized media streaming. A content server can obtain a user's psychoacoustic profile prior to beginning streaming. For instance the user may offer their demographic information, which can be used to predict the user's hearing profile. The audio data can then be (re)encoded at an optimal data rate using the individualized psychoacoustic profile. The invention disclosed allows the content provider to trade off server-side computational resources against the available data bandwidth to the receiver, which may be particularly relevant in situations where the endpoint is in a geographic region with more basic data infrastructure. This may also be useful in low power applications like personal area networks (PANs) (e.g. fully wireless earbuds)—a lower data rate means that radios can be switched off more frequently, which can lead to extended battery life.

A further application may be personalized storage optimization. In situations where audio is stored primarily for consumption by a single individual, then there may be benefit in using a personalized psychoacoustic model to get the maximum amount of content into a given storage capacity. Although the cost of digital storage is continually falling, there may still be commercial benefit of such technology for consumable content. Many people still download podcasts to consume which are then deleted following consumption to free up device space. Such an application of this technology could allow the user to store more content before content deletion is required.

Figure 8:
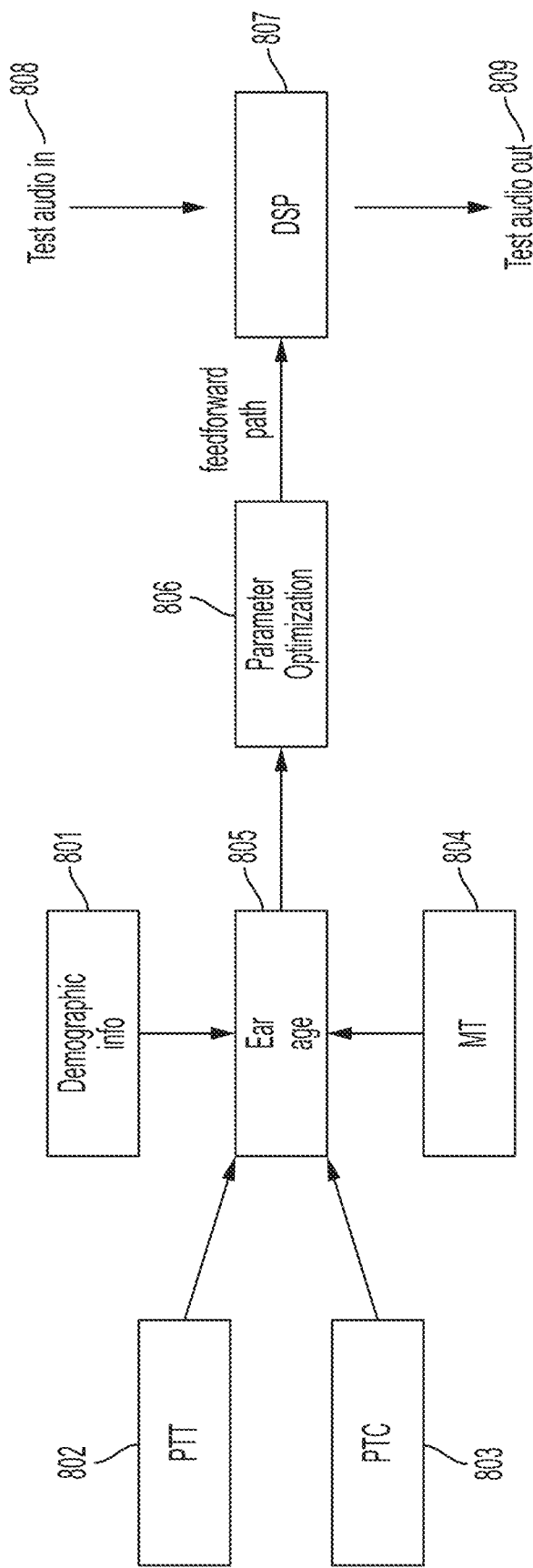
FIG. 8 illustrates a flow chart of a typical feed forward approach to parameterisation.

FIG. 8 illustrates a flow chart of a method utilized for parameter adjustment for an audio signal processing device intended to improve perceptual quality. Hearing data is used to compute an "ear age", 805, for a particular user. User's ear age is estimated from a variety of data sources for this user, including: demographic information 801, pure tone threshold ("PTT") tests 802, psychophysical tuning curves ("PTC") 803, and/or masked threshold tests ("MT") 804. Parameters are adjusted 806 according to assumptions related to ear age 805 and are output to a DSP, 807. Test audio 708 is then fed into DSP 807 and output 809. To this extent, parameter adjustment relies on a 'guess, check and tweak' methodology—which can be imprecise, inefficient and time consuming.

Figure 9:
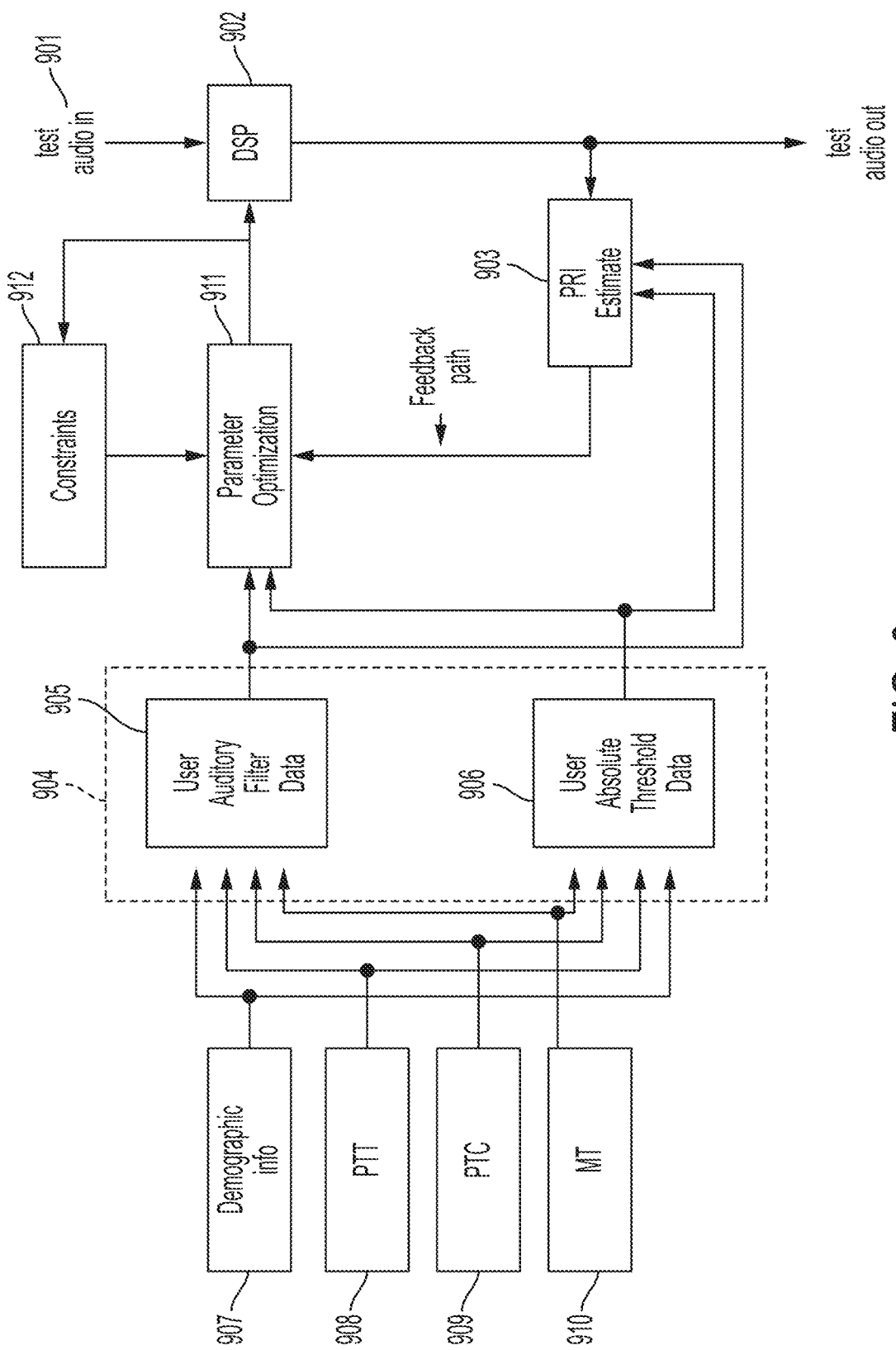
FIG. 9 illustrates a flow chart detailing a PRI approach to parameter optimization.

In order to more effectively parameterize a multiband dynamic processor, a PRI approach may be used. An audio sample, or body of audio samples 901, is first processed by a parameterized multiband dynamics processor 902 and the PRI of the processed output signal(s) is calculated 903 according to a user's hearing profile 904, FIG. 9. The hearing profile itself bears the masking and hearing thresholds of the particular user. The hearing profile may be derived from a user's demographic info 907, their PTT data 908, their PTC data 909, their MT data 910, a combination of these, or optionally from other sources. After PRI calculation, the multiband dynamic processor is re-parameterized according to a given set of parameter heuristics, derived from optimization 911, and from this the audio sample(s) is reprocessed and the PRI calculated. In other words, the multiband dynamics processor 902 is configured to process the audio sample so that it has an optimized PRI for the particular listener, taking into account the individual listener's personal hearing profile. To this end, parameterization of the multiband dynamics processor 902 is adapted to optimize the PRI of the processed audio sample over the unprocessed audio sample. The parameters of the multiband dynamics processor 902 are determined by an optimization process that uses PRI as its optimization criterion. Optionally, the PRI optimization process may be subject to constraints 912 to make the optimization process more efficient and worthwhile. This is performed by evaluating parameters within a given set of criteria to direct the end result to a level of signal manipulation that the end user deems tolerable (e.g. using EQ coloration criteria or against harmonic distortion and noise criteria to limit the optimization space, as discussed further in FIGS. 14 and 15A-B). The above approach for processing an audio signal based on optimizing PRI and taking into account a listener's hearing characteristics may not only be based on multiband dynamic processors, but any kind of parameterized audio processing function that can be applied to the audio sample and its parameters determined so as to optimize PRI of the audio sample.

The PRI optimization approach taken depends on the PRI measure used. A simple approach to optimizing PRI is to maximize the PRI, for example this can be done when PRI is calculated as perceptual entropy. An alternative approach is to use a healthy listener as a PRI reference, and optimize PRI for a hearing impaired listener by minimizing the measured PRI deviation from this reference, an example of this approach might be when PRI is calculated as specific loudness.

The parameters of the audio processing function may be determined for an entire audio file, for a corpus of audio files, or separately for portions of an audio file (e.g. for specific frames of the audio file). The audio file(s) may be analyzed before being processed, played or encoded. Processed and/or encoded audio files may be stored for later usage by the particular listener (e.g. in the listeners audio archive). For example, an audio file (or portions thereof) encoded based on the listener's hearing profile may be stored or transmitted to a far-end device such as an audio communication device (e.g. telephone handset) of the remote party. Alternatively, an audio file (or portions thereof) processed using a multiband dynamic processor that is parameterized according to the listener's hearing profile may be stored or transmitted.

Various optimization methods are possible to maximize the PRI of the audio sample, depending on the type of the applied audio processing function such as the above mentioned multiband dynamics processor. For example, a subband dynamic compressor may be parameterized by compression threshold, time constant (or separate attack/release times), gain and compression ratio for each subband, and these parameters may be determined by the optimization process. In some cases, the effect of the multiband dynamics processor on the audio signal is nonlinear and an appropriate optimization technique is required. The number of parameters that need to be determined may become large, e.g. if the audio signal is processed in many subbands and a plurality of parameters needs to be determined for each subband. In such cases, it may not be practicable to optimize all parameters simultaneously and a sequential approach to parameter optimization may be applied. Different approaches to sequential optimization are proposed below. Although these sequential optimization procedures do not necessarily result in the optimum parameters, the obtained parameter values result in increased PRI over the unprocessed audio sample, thereby improving the user's listening experience.

A brute force approach to multi-dimensional optimization of processing parameters is based on trial and error and successive refinement of a search grid. First, a broad search range is determined based on some a priori expectation on where an optimal solution might be located in the parameter space. Constraints on reasonable parameter values may be applied to limit the search range. Then, a search grid or lattice having a coarse step size is established in each dimension of the lattice. One should note that the step size may differ across parameters. For example, a compression threshold may be searched between 50 and 90 dB, in steps of 10 dB. Simultaneously, a compression ratio between 0.1 and 0.9 shall be searched in steps of 0.1. Thus, the search grid has 5×9=45 points. PRI is determined for each parameter combination associated with a search point and the maximum PRI for the search grid is determined. The search may then be repeated in a next iteration, starting with the parameters with the best result and using a reduced range and step size. For example, a compression threshold of 70 dB and a compression rate of 0.4 were determined to have maximum PRI in the first search grid. Then, a new search range for thresholds between 60 dB and 80 dB and for ratios between 0.3 and 0.5 may be set for the next iteration. The step sizes for the next optimization may be determined to 2 dB for the threshold and 0.05 for the ratio, and the combination of parameters having maximum PRI determined. If necessary, further iterations may be performed for refinement. Other and additional parameters of the signal processing function may be considered, too. In case of a multiband compressor, parameters for each subband must be determined. Simultaneously searching optimum parameters for a larger number of subbands may, however, take a long time or even become unfeasible. Thus, the present disclosure suggests various ways of structuring the optimization in a sequential manner to perform the parameter optimization in a shorter time without losing too much precision in the search. The disclosed approaches are not limited to the above brute force search but may be applied to other optimization techniques as well.

Figure 10:
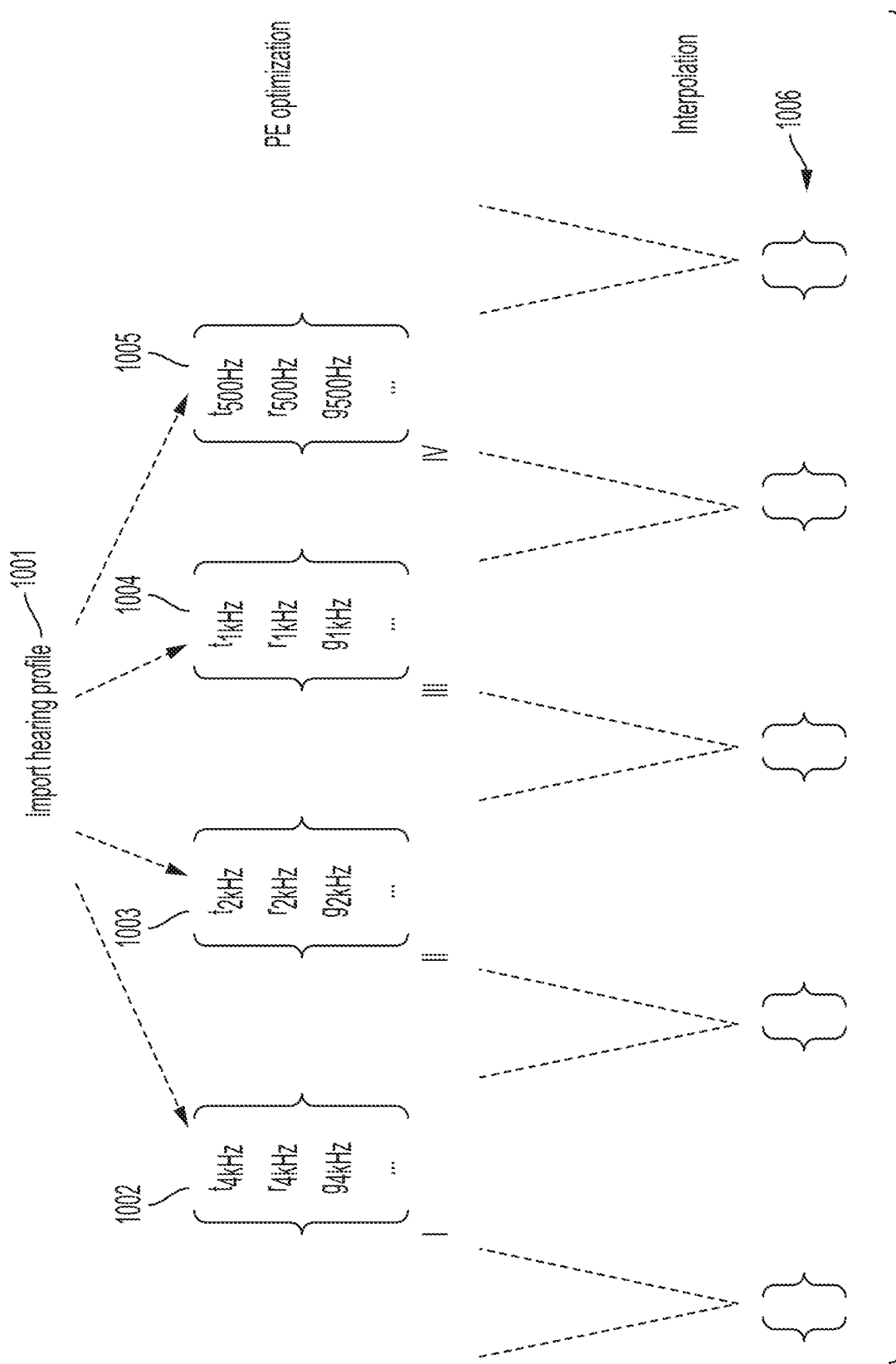
FIG. 10 illustrates one method of PRI optimization amongst subbands in a multiband dynamic processor.

One mode of optimization may occur, for example, by first optimizing subbands successively around available psychophysical tuning curve (PTC) data 1001 in non-interacting subbands, i.e. bands that are sufficiently spectrally remote such that the masking contributions upon one another are insignificant, FIG. 10. For instance, the results of a 4 kHz PTC test 1001 are first imported and optimization at 4 kHz is performed to maximize PRI for this subband by adjusting compression thresholds $t_i$, gains $g_i$ and ratios $r_i$ 902. Successive octave bands are then optimized, around 2 kHz 903, 1 kHz 904 and 500 Hz 905. After this is performed, the parameters of the remaining subbands can be interpolated 906. Additionally, imported PTC results 901 can be used to estimate PTC and audiogram data at other frequencies, such as at 8 kHz, following which the 8 kHz subband can be optimized accordingly.

Figure 11:
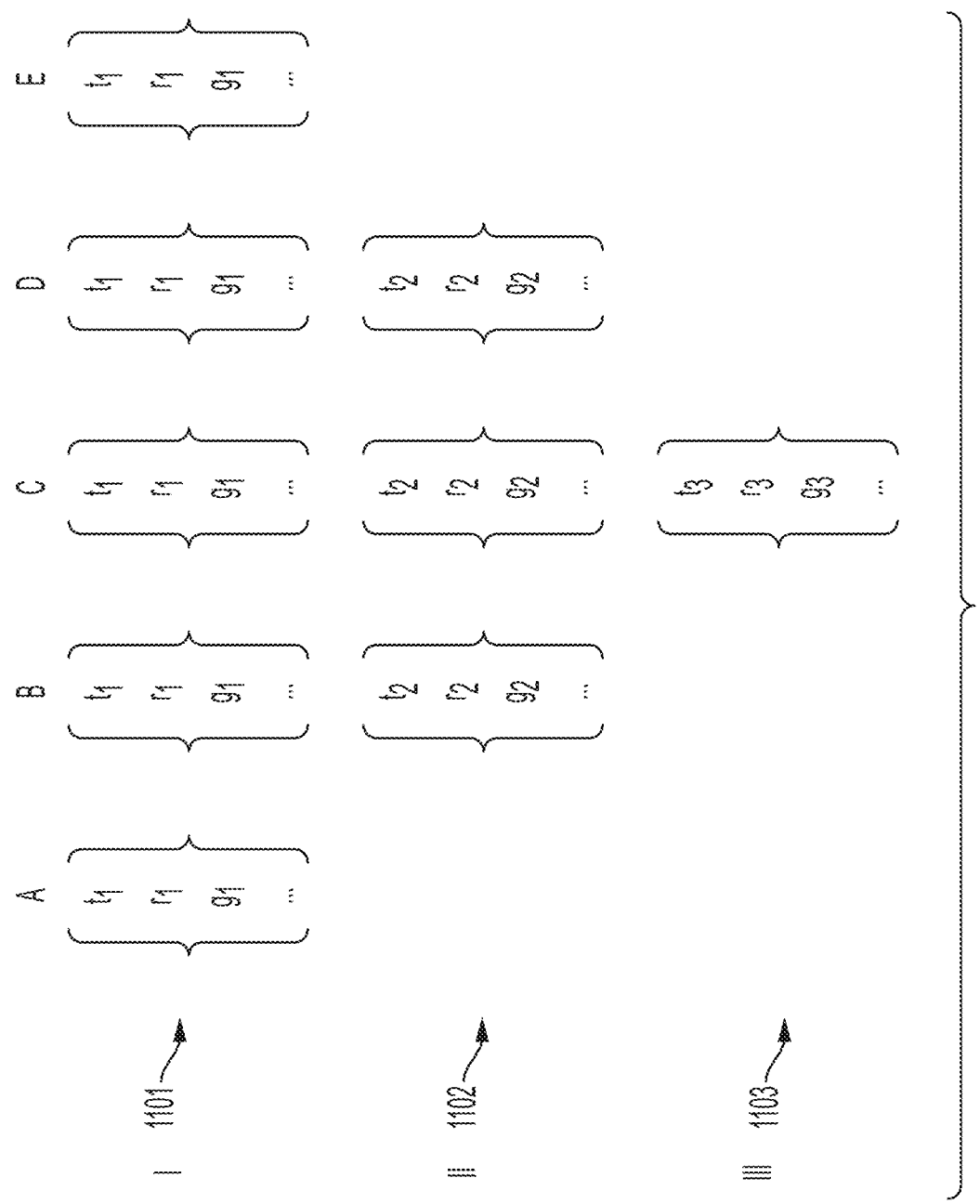
FIG. 11 illustrates another method of PRI optimization, wherein optimization is increasingly granularized.

Another optimization approach would be to first optimize around the same parameter values FIG. 11, fixed amongst a plurality of (e.g. every) subband 1101. In this instance, the compression threshold and ratios would be identical in all subbands, but the values adjusted so as to optimize PRI. Successive iteration would then granularize the approach 1102, 1103—keeping the parameters tied amongst subbands but narrowing down the number of subbands that are being optimized simultaneously until finally optimizing one individual subband. The results of the optimization of the previous step could be used as a starting point for the current optimization across fewer subbands. In addition, it might be possible to adjust other optimization parameters for a more precise optimization around the starting point. For example, the step size of a search for optimal parameter values might be reduced. The process would then be iterated with a new initial set of subbands and successive reduction of considered subbands so as to find a solution for each subband. Once each subband is optimized, their individual parameters may be further refined by again optimizing adjacent bands. For example, parameters of adjacent bands may be averaged or filtered (on a parameter type by parameter type basis, e.g. filtering of thresholds) so as to obtain a smoother transition of parameters across subbands. Missing subband parameters may be interpolated.

Figure 12:
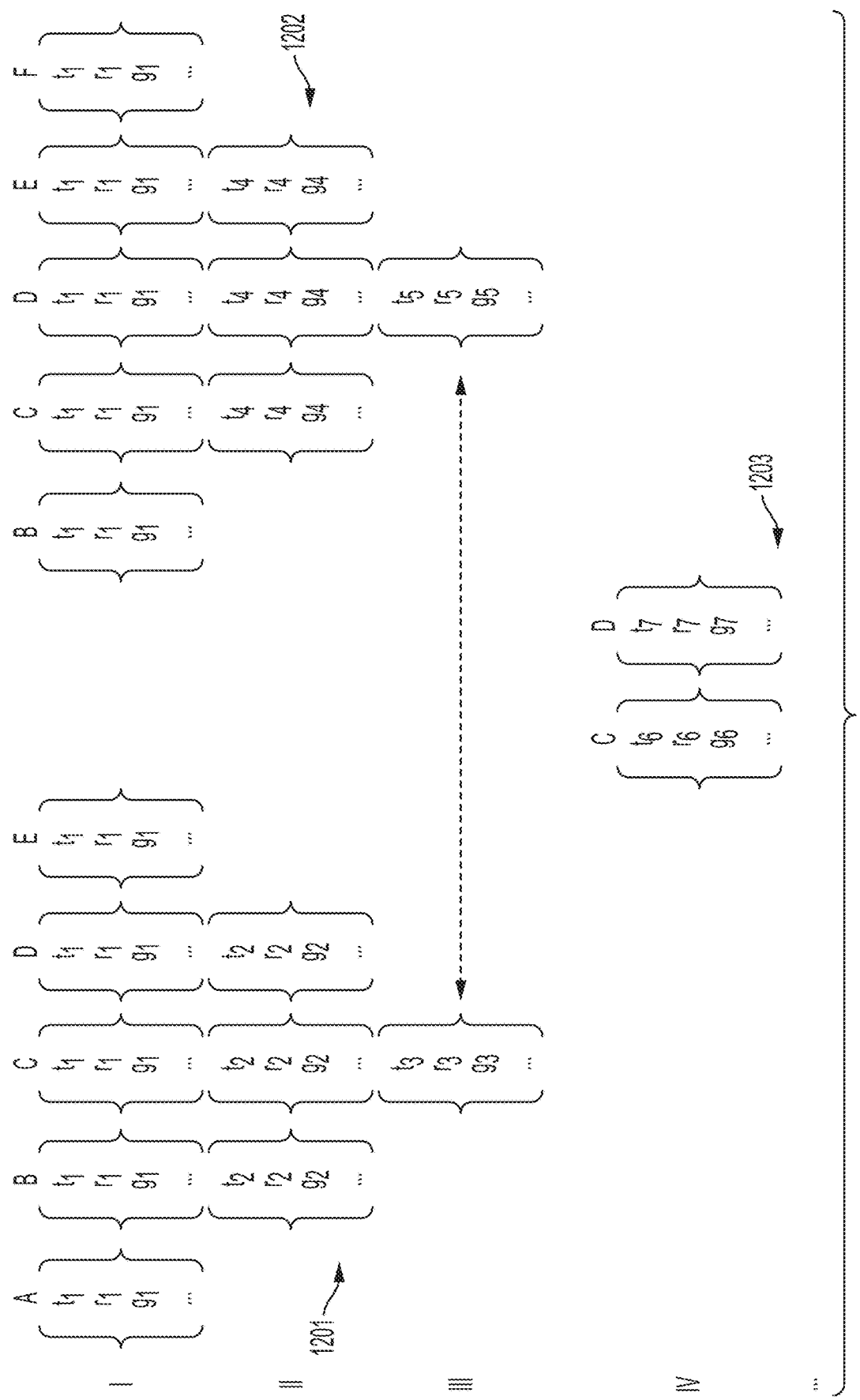
FIG. 12 illustrates a further refinement of the method illustrated in FIG. 10.
Figure 13:
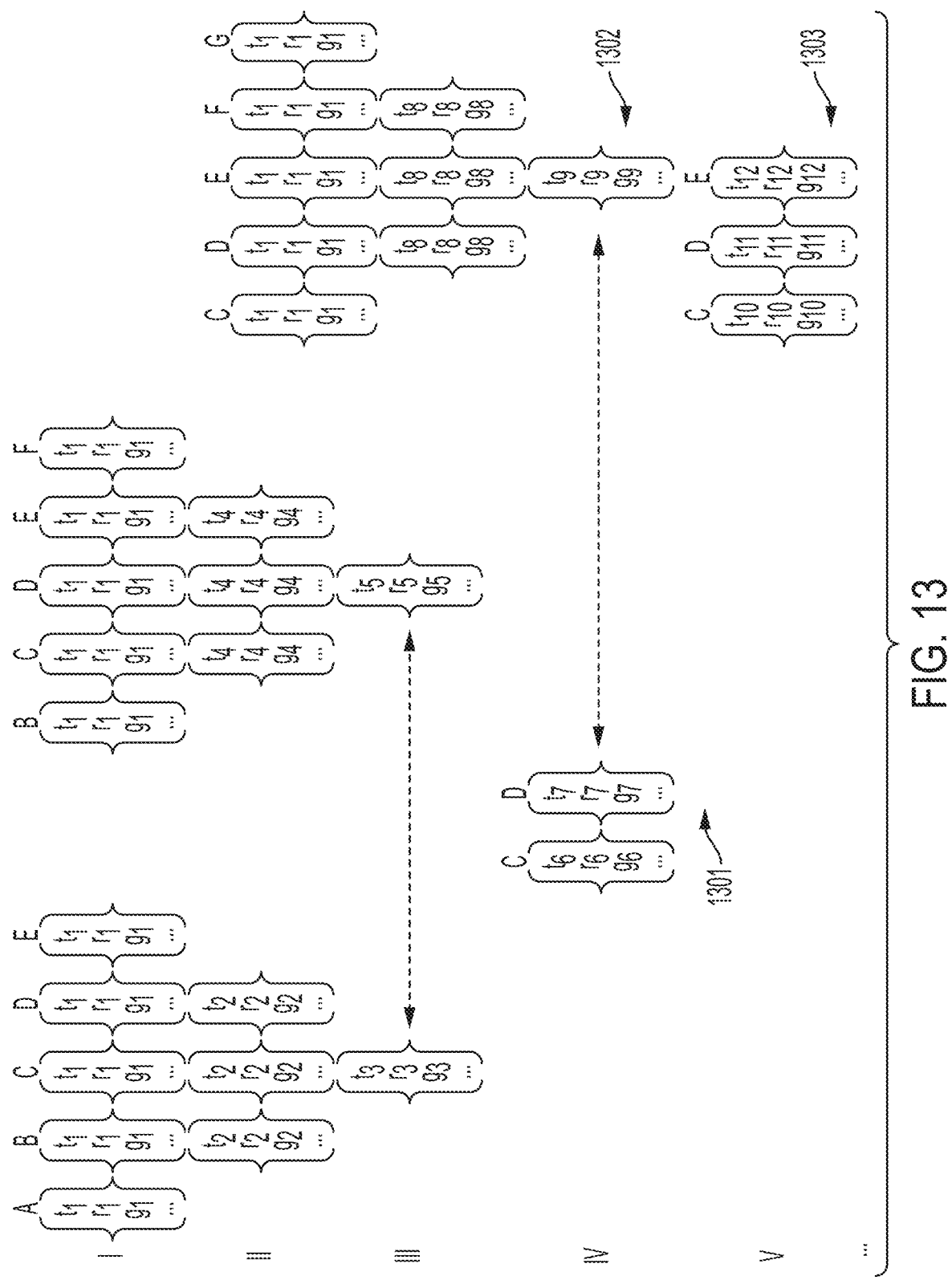
FIG. 13 illustrates further refinement of the method illustrated in FIG. 11.

For example in FIG. 11, subbands A-E are optimized to determine parameters $[t_1, r_1, g_1, \ldots]$ 1101 for compression threshold $t_1$, ratio $r_1$ and gain $g_1$. Other or additional parameters may be optimized as well. Next subbands B-D are optimized to determine new parameters $[t_2, r_2, g_2, \ldots]$ 1102 from the previously obtained parameters $[t_1, r_1, g_1, \ldots]$, and then finally subband C is optimized to determine new parameters C: $[t_3, r_3, g_3, \ldots]$ 1103 from parameters $[t_2, r_2, g_2, \ldots]$. As mentioned above, the previously obtained parameters may be used as a starting point for the subsequent optimization step. The approach seeks to best narrow down the optimal solution per subband by starting with fixed values across many subbands. The approach can be further refined, as illustrated in FIG. 12. Here, subbands C and D are optimized 1201, 1202 according to the approach in FIG. 11, resulting in parameters for subbands C: $[t_3, r_3, g_3, \ldots]$ and D: $[t_5, r_5, g_5, \ldots]$. Subsequently, these adjacent bands are then optimized together, resulting in refined parameters for subbands C: $[t_6, r_6, g_6, \ldots]$ and D: $[t_7, r_7, g_7, \ldots]$ 1203. This could be taken a step further, as illustrated in FIG. 13, where subbands C and D are optimized with previously optimized subband E: $[t_9, r_9, g_9, \ldots]$ 1301, 1302, resulting in new parameter set C: $[t_{10}, r_{10}, g_{10}, \ldots]$, D: $[t_{11}, r_{11}, g_{11}, \ldots]$, E: $[t_{12}, r_{12}, g_{12}, \ldots]$ 1303.

The main consideration in both approaches is strategically constraining parameter values—methodically optimizing subbands in a way that takes into account the functional processing of the human auditory system while narrowing the universe of possibilities. This comports with critical band theory. As mentioned previously, a critical band relates to the band of audio frequencies within which an additional signal component influences the perception of an initial signal component by auditory masking. These bands are broader for individuals with hearing impairments—and so optimizing first across a broader array of subbands (i.e. critical bands) will better allow an efficient calculation approach.

In addition to using the strategic methods mentioned above to constrain the PRI optimization space, other practical approaches may be used as it is expected that a number of parameter combinations may lead to processed outputs that will not fit into basic audio quality criteria. This will depend on the processing employed.

A constrainer may be introduced into the PRI based fitting process (see constrainer block in FIG. 9) to support the PRI optimizer through introduction of rules or constraints. Such rules or constraints encompass ensuring sound quality or even considering subjective preference of listeners. The introduction of this component reduces the parameter space and increases the efficiency and overall effectiveness of the whole PRI optimization process, making the search for maximum PRI within a parameter space of such dimensions feasible—while avoiding unwanted/undesirable local optima.

The rules within the constrainer are defined based on knowledge on the processing being fitted to. Hence rules can be adapted to the specific processing and its parameters. Some examples of potential cases that do not fit basic audio quality criteria are the following. The optimization of parameter combinations through maximization of PRI can result in processing that applies excessive compression or gain to input signals, leading to undesired processing artifacts such as distortion or clipping. It can also lead to poor distribution of spectral energy across frequency bands. Due to the independence of parameter values across frequency bands, distribution of spectral energy across frequency can result in coloration profiles that can be expected to be disliked by listeners. Such cases can be avoided through constraints. The limit value to some of the constraints introduced may be dependent on hearing profiles. In such a case the constrainer can also take a hearing profile as an input and adapt the constraint limits to the hearing profile.

Figure 14:
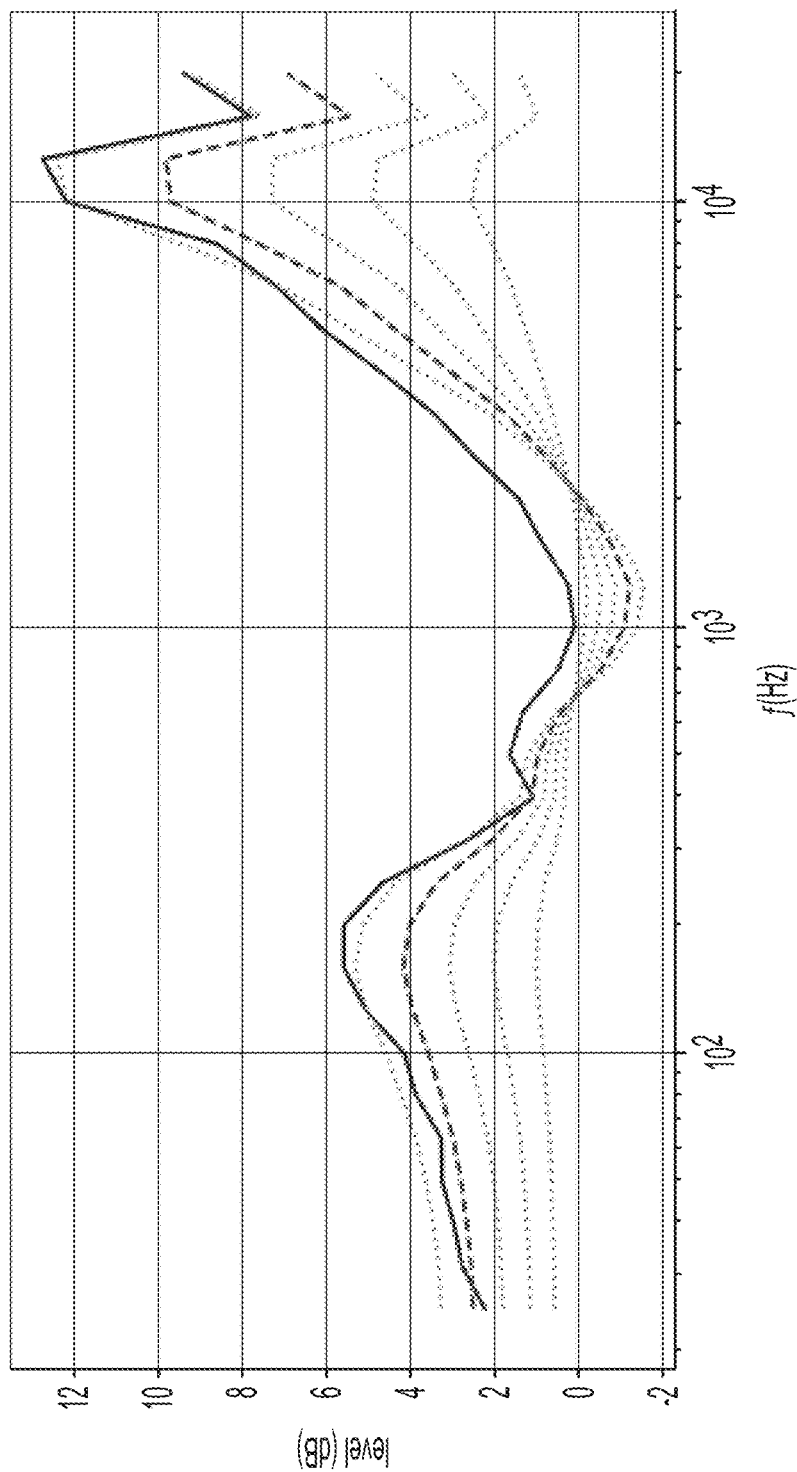
FIG. 14 illustrates an exemplary coloration profile of presets evaluated through a preference study.

FIG. 14 presents an example in which constraints are introduced in the PRI optimization process to limit parameter combinations to those that will result in a tolerable coloration profile (defined by the energy distribution across frequency bands), where the coloration profile that corresponds to a given parameter combination and its associated processing is calculated by processing a reference signal and computing the difference in level between the non-processed and processed reference signal across frequency bands. The coloration profile corresponding to a parameter combination, referred to in this example as evaluated coloration profile (black line, FIG. 14), is compared to coloration profiles subjectively evaluated through a preference study (dotted lines, FIG. 14). This example counts with access to data on preference for coloration profiles rated by listeners. These are referred to in this example as preference study coloration profiles. The evaluated coloration profile is matched to one of the preference study coloration profiles (dashed line, FIG. 14). The matching phase can be done by selecting minimum rms difference between evaluated and preference study coloration profiles. If the matched coloration profile is tolerated by listeners (as ascertained by data), it is predicted the evaluated coloration profile will also result in a tolerable coloration profile. If on the other hand the matched coloration profile is not tolerated by listeners, the evaluated coloration profile is predicted to also result in a non-tolerable coloration profile and is discarded before computing a PRI score. Toleration of coloration profiles may vary across hearing profiles. In such case, the constrainer can use data on toleration of coloration profiles that varies across hearing profiles.

Total harmonic distortion plus noise ($thd_n$) is an example of a measure of distortion introduced by processing. It is usually measured by inputting a sine wave into the processing, notch filtering the output, and comparing the ratio between the output signal with and without the sine wave. In this example, the ratio is expressed in dB. $Thd_n$ can be used to constraint the PRI optimization search from parameter combinations that introduce excessive distortion. In the example illustrated in FIG. 15A, $thd_n$ levels for a sample of parameter combinations are presented. It presents an exploration of $thd_n$ across combinations of param 1 and param 2 where darker regions correspond to higher $thd_n$ levels and lighter regions correspond to lower $thd_n$ levels. These parameters could be, for example, the threshold, or the ratio of a compressive system. In this example, $thd_n$ levels above 5 dB (darker regions) are considered an indicator of excessive distortion and therefore parameter combinations with $thd_n$ above this level will be discarded before computing a PRI score. The $thd_n$ limit for excessive distortion set in this example at 5 dB is obtained through a prior exploration phase based on tolerance data for this specific constraint.

Figures 15A, 15B:
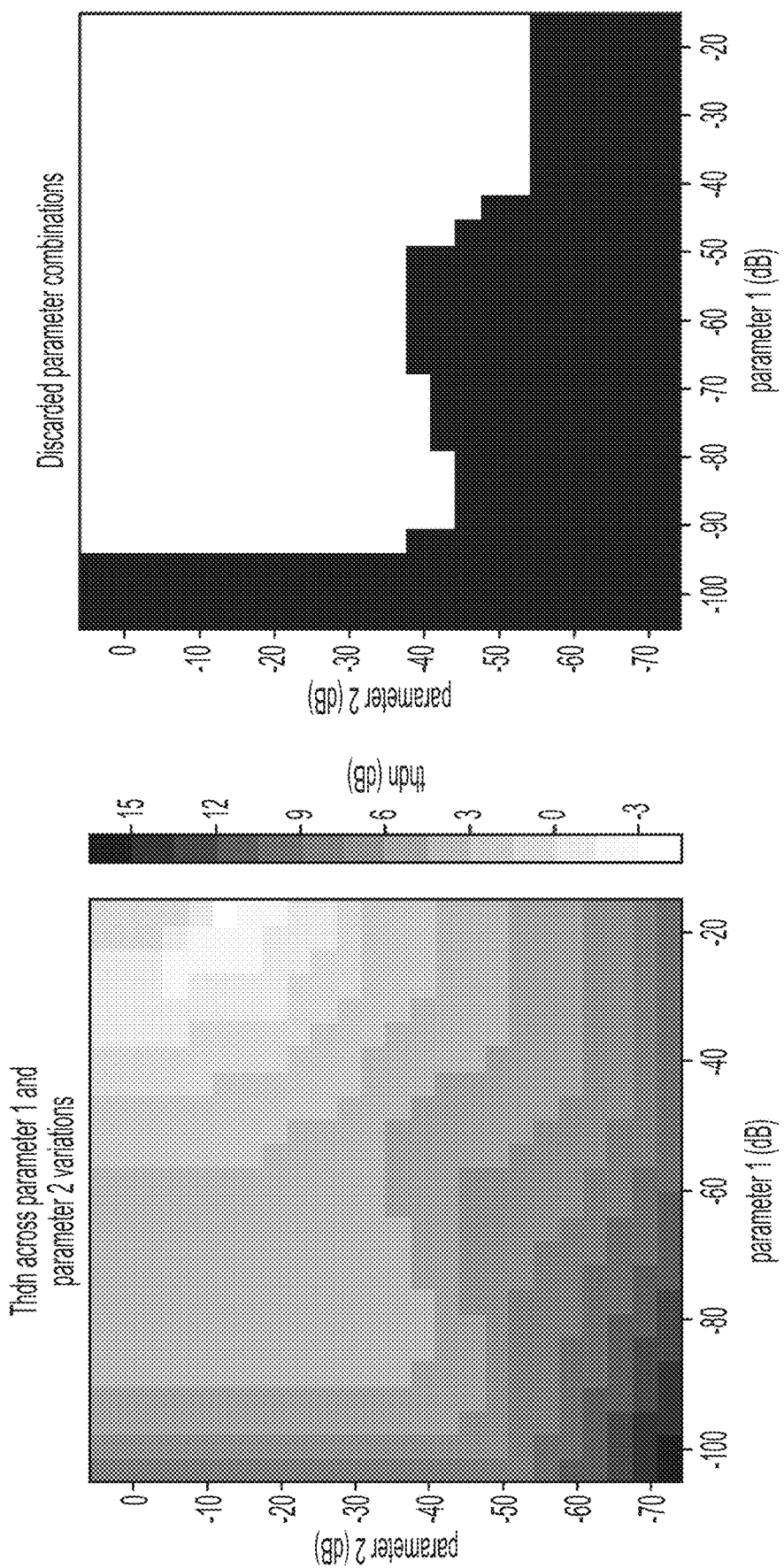
FIGS. 15A-B illustrate graphs depicting an exemplary evaluation of presets based on total harmonic noise and distortion.

FIG. 15B presents the parameter combinations which will result in tolerable (white) and non-tolerable (black) $thd_n$ levels for parameter space explored in FIG. 15A. Parameter combinations corresponding to black regions will be discarded before computing PRI. This step significantly reduces the computational costs of the process. Alternatively, as a less aggressive constraint, the $thd_n$ score can be used by the optimization process through a weighting procedure. The computation of $thd_n$ is based on well-defined test signals that independent of any audio material and therefore non-permissible regions of parameter space can be identified before the more computationally expensive PRI optimization. This leads to both a more efficient and desirable result.

Figure 16:
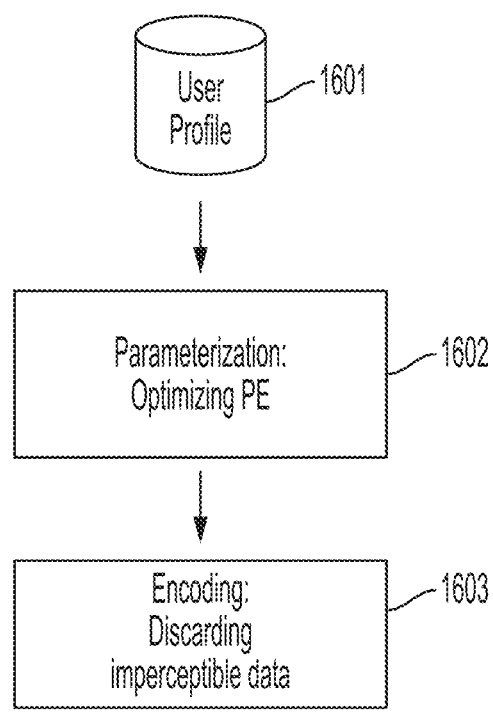
FIG. 16 illustrates a flow chart detailing perceptually relevant information parameter optimization followed by perceptual coding.

FIG. 16 illustrates a flow chart detailing how one may optimize first for PRI 1602 based on a user's hearing profile 1601, and then encode the file 1603, utilizing the newly parameterized multiband dynamic processor to first process the audio file and then encode it, discarding any remaining perceptually irrelevant information. This has the dual benefit of first increasing PRI for the hearing impaired individual, thus adding perceived clarity, while also still reducing the audio file size.

In the following, a method is proposed to derive a pure tone threshold from a psychophysical tuning curve using an uncalibrated audio system. This allows the determination of a user's hearing profile without requiring a calibrated test system. For example, the tests to determine the PTC of a listener and his/her hearing profile can be made at the user's home using his/her personal computer, tablet computer, or smartphone. The hearing profile that is determined in this way can then be used in the above audio processing techniques to increase coding efficiency for an audio signal or improve the user's listening experience by selectively processing frequency bands of the audio signal to increase PRI.

Figure 17:
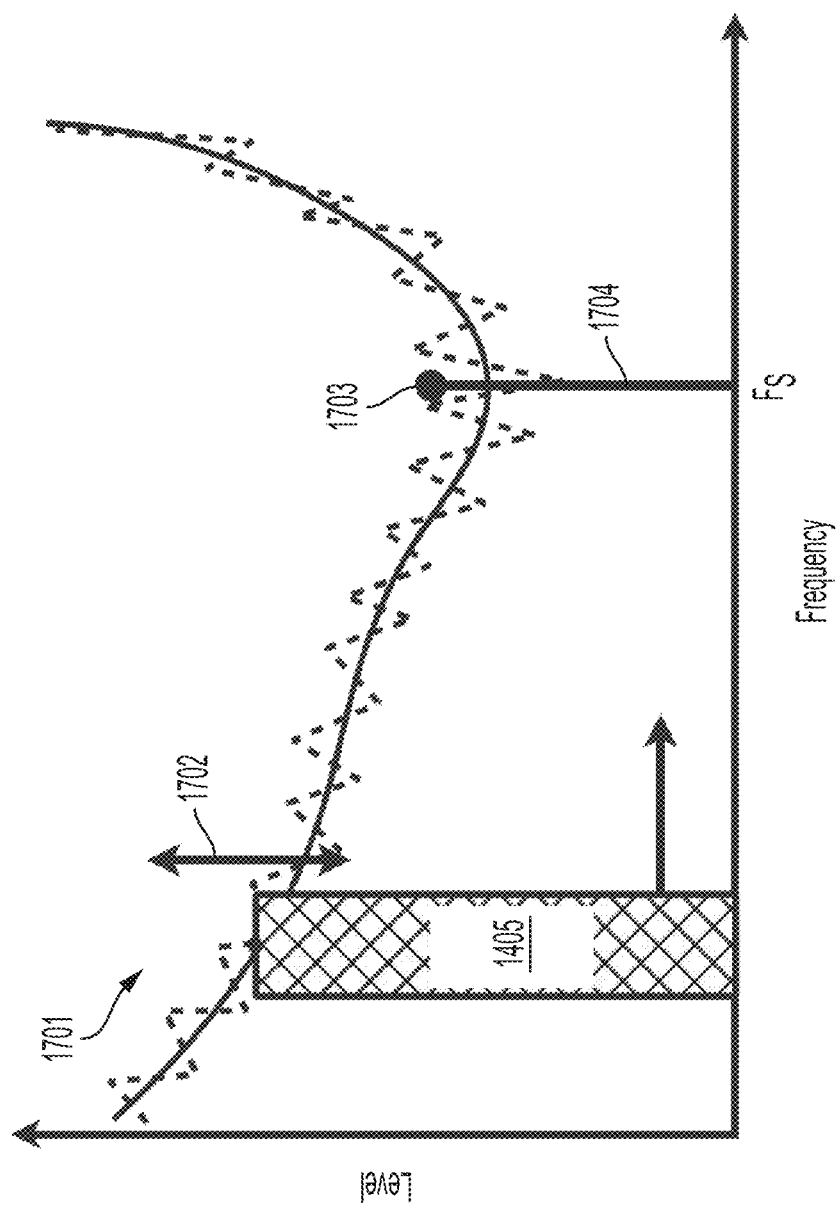
FIG. 17 shows an illustration of a PTC measurement.

FIG. 17 shows an illustration of a PTC measurement. A signal tone 1703 is masked by a masker signal 1705 particularly when sweeping a frequency range in the proximity of the signal tone 1703. The test subject indicates at which sound level he/she hears the signal tone for each masker signal. The signal tone and the masker signal are well within the hearing range of the person. The diagram shows on the x-axis the frequency and on the y-axis the audio level or intensity in arbitrary units. While a signal tone 1703 that is constant in frequency and intensity 1704 is played to the person, a masker signal 1705 slowly sweeps from a frequency lower to a frequency higher than the signal tone 1703. The rate of sweeping is constant or can be controlled by the test subject or the operator. The goal for the test subject is to hear the signal tone 1703. When the test subject does not hear the signal tone 1703 anymore (which is for example indicated by the subject releasing a push button), the masker signal intensity 1702 is reduced to a point where the test subject starts hearing the signal tone 1703 (which is for example indicated by the subject pressing the push button). While the masker signal tone 1705 is still sweeping upwards in frequency, the intensity 1702 of the masker signal 1705 is increased again, until the test person does not hear the signal tone 1703 anymore. This way, the masker signal intensity oscillates around the hearing level 1701 (as indicated by the solid line) of the test subject with regard to the masker signal frequency and the signal tone. This hearing level 1701 is well established and well known for people having no hearing loss. Any deviations from this curve indicate a hearing loss (see for example FIG. 18).

Figure 18:
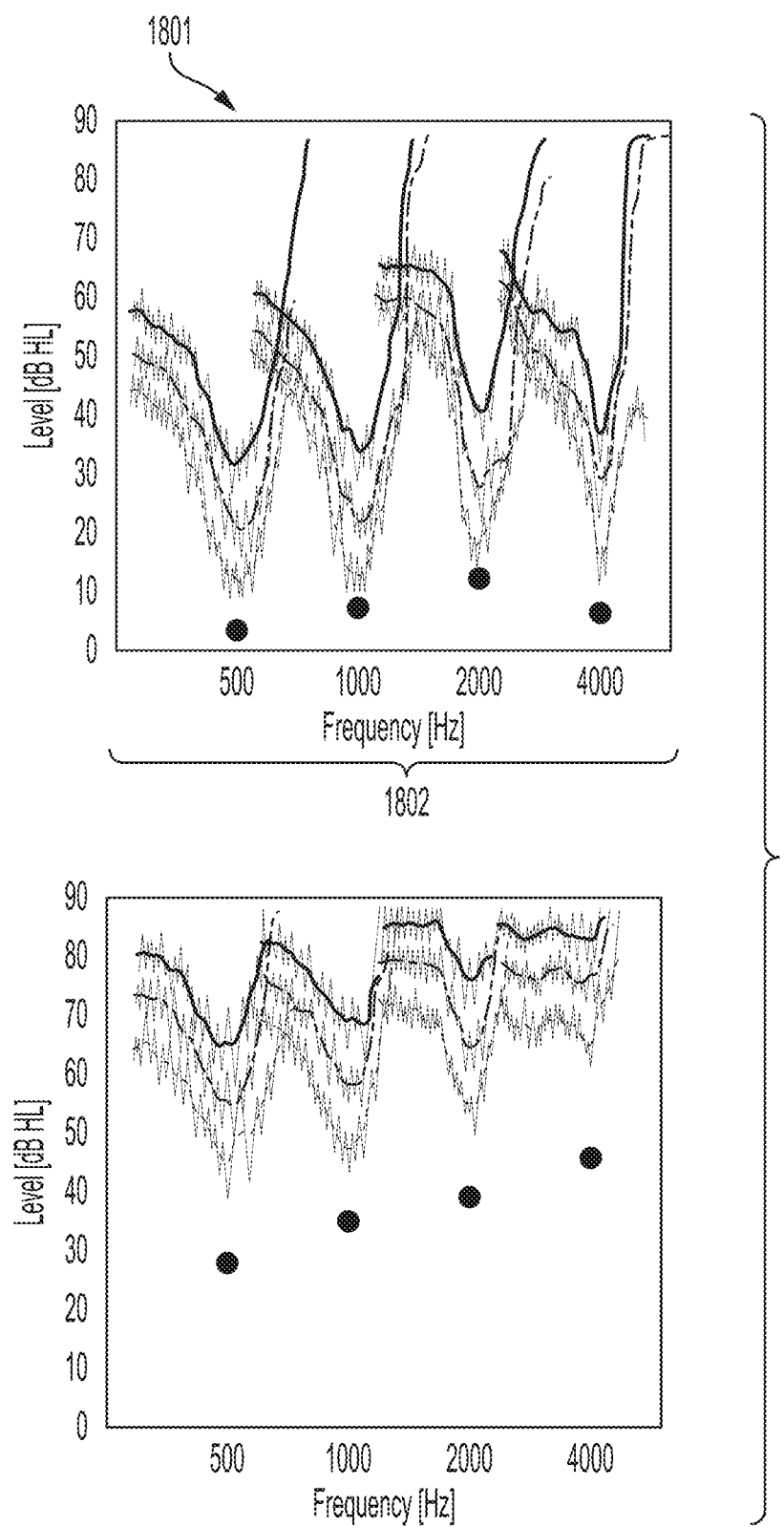
FIG. 18 shows PTC test results acquired on a calibrated setup in order to generate a training set.

FIG. 18 shows the test results acquired with a calibrated setup in order to generate a training set for training of a classifier that predicts pure-tone thresholds based on PTC features of an uncalibrated setup. The classifier may be, e.g., a linear regression model. Therefore, the acquired PTC tests can be given in absolute units such as dB HL. However, this is not crucial for the further evaluation. In the present example, four PTC tests at different signal tone frequencies (500 Hz, 1 kHz, 2 kHz and 4 kHz) and at three different sound levels (40 dB HL, 30 dB HL and 20 dB HL indicated by line weight; the thicker the line the lower the signal tone level) for each signal tone have been performed. Therefore, at each signal tone frequency, there are three PTC curves. The PTC curves each are essentially v-shaped. Dots below the PTC curves indicate the results from a calibrated—and thus absolute-pure tone threshold test performed with the same test subject. On the upper panel 1801, the PTC results and pure tone threshold test results acquired from a normal hearing person are shown (versus the frequency 1802), wherein on the lower panel, the same tests are shown for a hearing impaired person. In the example shown, a training set comprising 20 persons, both normal hearing and hearing impaired persons, has been acquired.

Figure 19:
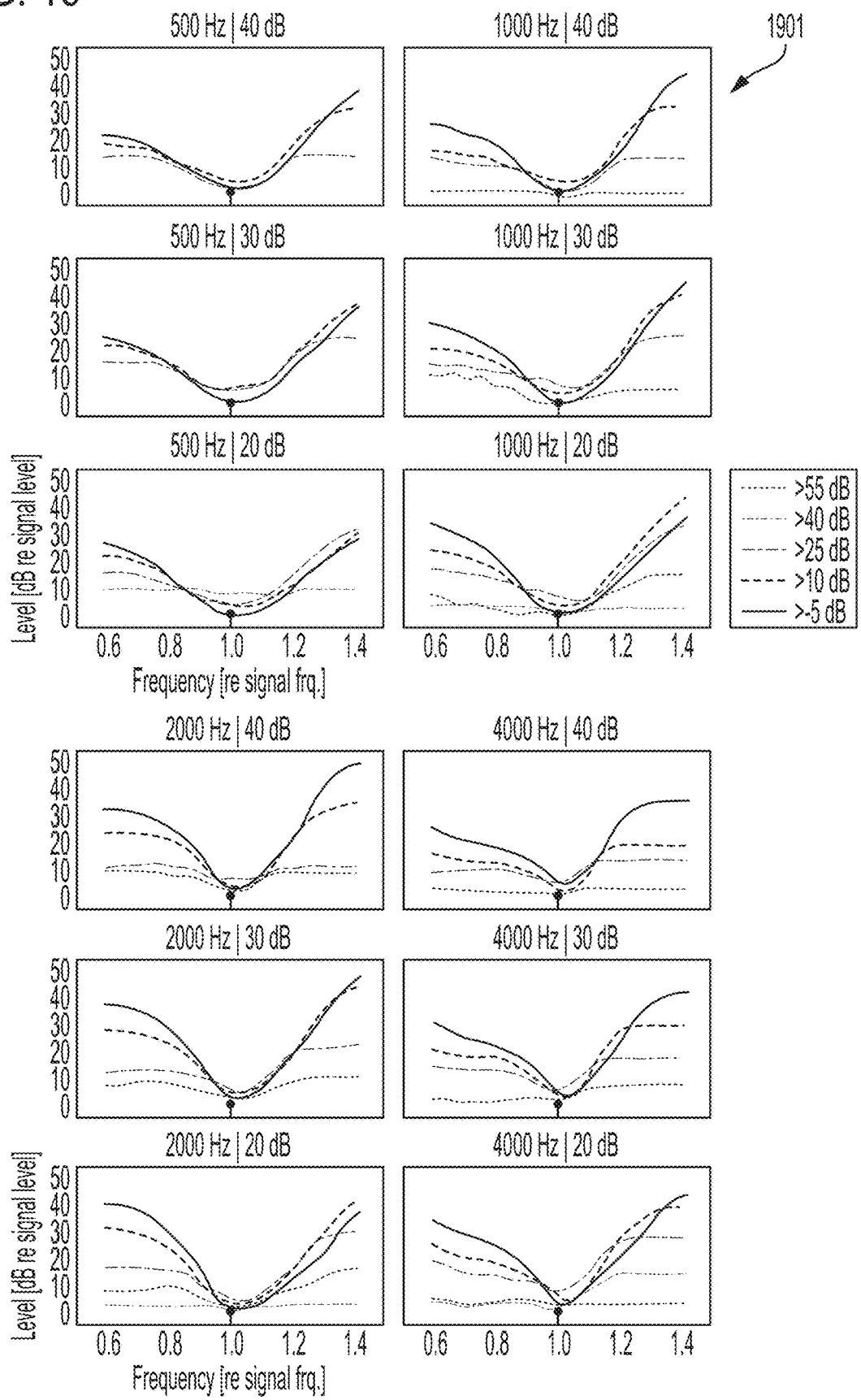
FIG. 19 shows a summary of PTC test results.

In FIG. 19 a summary of PTC test results of a training set are shown 1901. The plots are grouped according to single tone frequency and sound level resulting in 12 panels. In each panel the PTC results are grouped in 5 groups (indicated by different line styles), according to their associated pure tone threshold test result. In some panels pure tone thresholds were not available, so these groups could not be established. The groups comprise the following pure tone thresholds indicated by line colour: thin dotted line: >55 dB, thick dotted line: >40 dB: dash-dot line>25 dB, dashed line: >10 dB and continuous line: >−5 dB. The PTC curves have been normalized relative to signal frequency and sound level for reasons of comparison. Therefore, the x-axis is normalized with respect to the signal tone frequency. The x-axes and y-axes of all plots show the same range. As can easily be discerned across all graphs, elevations in threshold gradually coincide with wider PTCs, i.e. hearing impaired (HI) listeners have progressively broader tuning compared to normal hearing (NH) subjects. This qualitative observation can be used for quantitatively determining at least one pure tone threshold from the shape-features of the PTC. Modelling of the data may be realised using a multivariate linear regression function of individual pure tone thresholds against corresponding PTCs across listeners, with separate models fit for each experimental condition (i.e. for each signal tone frequency and sound level). To capture the dominant variabilities of the PTCs across listeners—and in turn reduce dimensionality of the predictors, i.e. to extract a characterizing parameter set—PTC traces are subjected to a principle component analysis (PCA). Including more than the first five PCA components does not improve predictive power.

Figure 20:
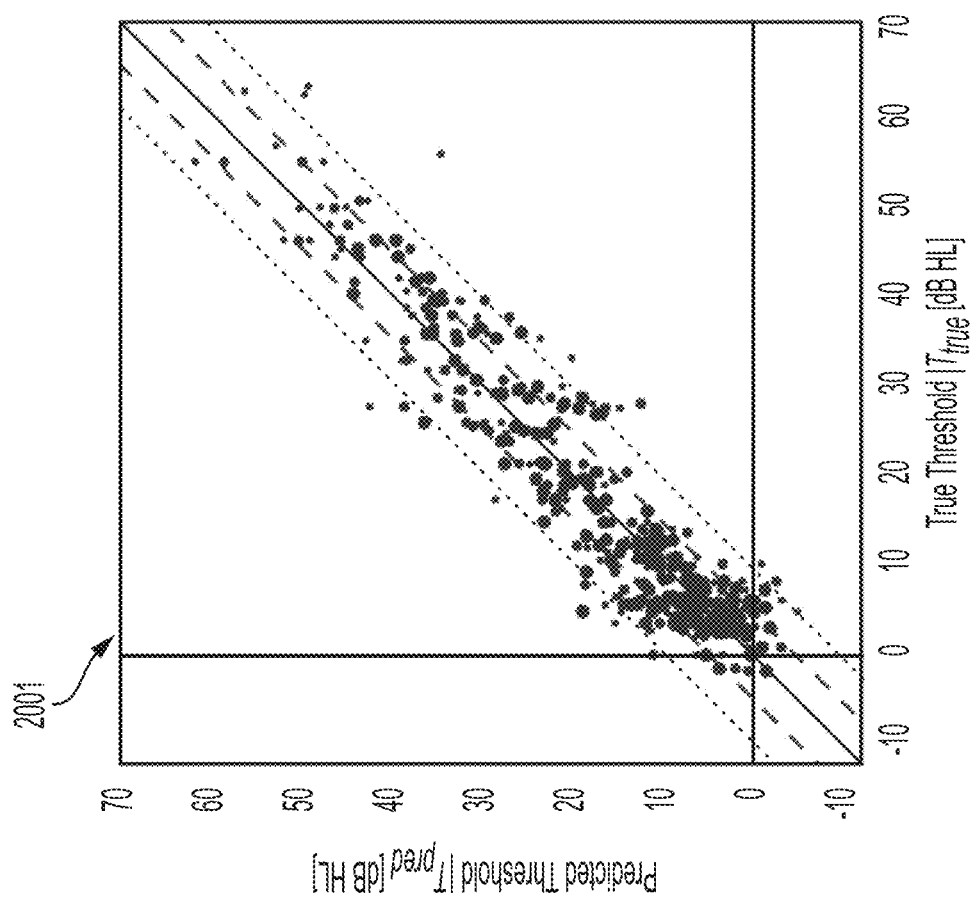
FIG. 20 summarizes fitted models' threshold predictions.

FIG. 20 summarizes the fitted models' threshold predictions. Across all listeners and conditions, the standard absolute error of estimation amounted to 4.8 dB, 89% of threshold estimates were within standard 10 dB variability. Plots of regression weights across PTC masker frequency indicate that mostly low-, but also high-frequency regions of a PTC trace are predictive of corresponding thresholds. Thus, with the such generated regression function it is possible to determine an absolute pure tone threshold from an uncalibrated audio-system, as particularly the shape-feature of the PTC can be used to derive from a PTC of unknown absolute sound level the absolute pure tone threshold. FIG. 20 shows 2001 the PTC-predicted vs. true audiometric pure tone thresholds across all listeners and experimental conditions (marker size indicates the PTC signal level). Dashed (dotted) lines represent unit (double) standard error of estimate.

Figure 21:
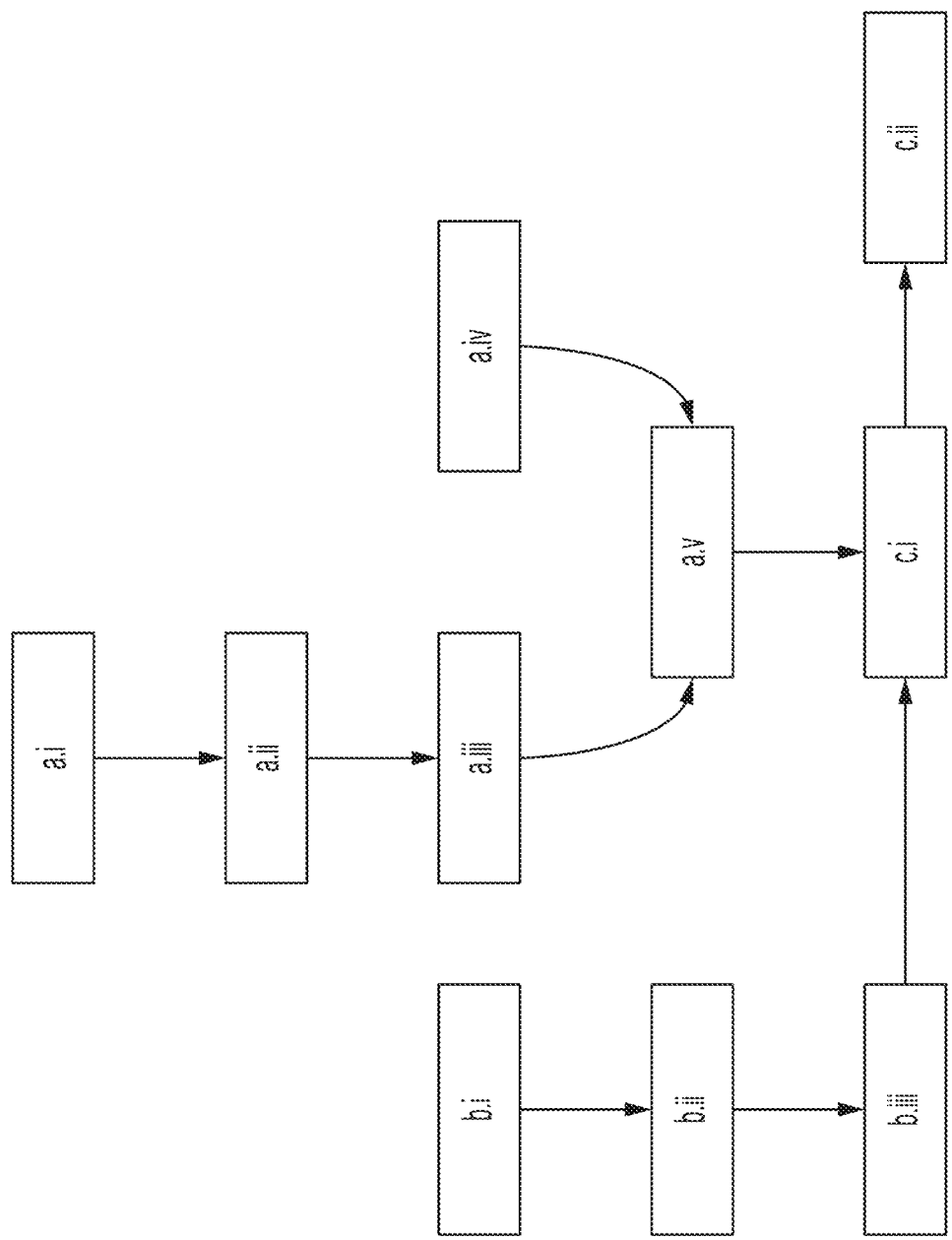
FIG. 21 shows a flow diagram of a method to predict pure-tone threshold.

FIG. 21 shows a flow diagram of the method to predict pure-tone thresholds based on PTC features of an uncalibrated setup. First, a training phase is initiated, where on a calibrated setup, PTC data are collected (step a.i). In step a.ii these data are pre-processed and then analysed for PTC features (step a.iii). The training of the classifier (step a.v) takes the PTC features (also referred to as characterizing parameters) as well as related pure-tone thresholds (step a.iv) as input. The actual prediction phase starts with step b.i, in which PTC data are collected on an uncalibrated setup. These data are pre-processed (step b.ii) and then analysed for PTC features (step b.iii). The classifier (step c.i) using the setup it developed during the training phase (step a.v) predicts at least one pure-tone threshold (step c.ii) based on the PTC features of an uncalibrated setup.

Figure 22:
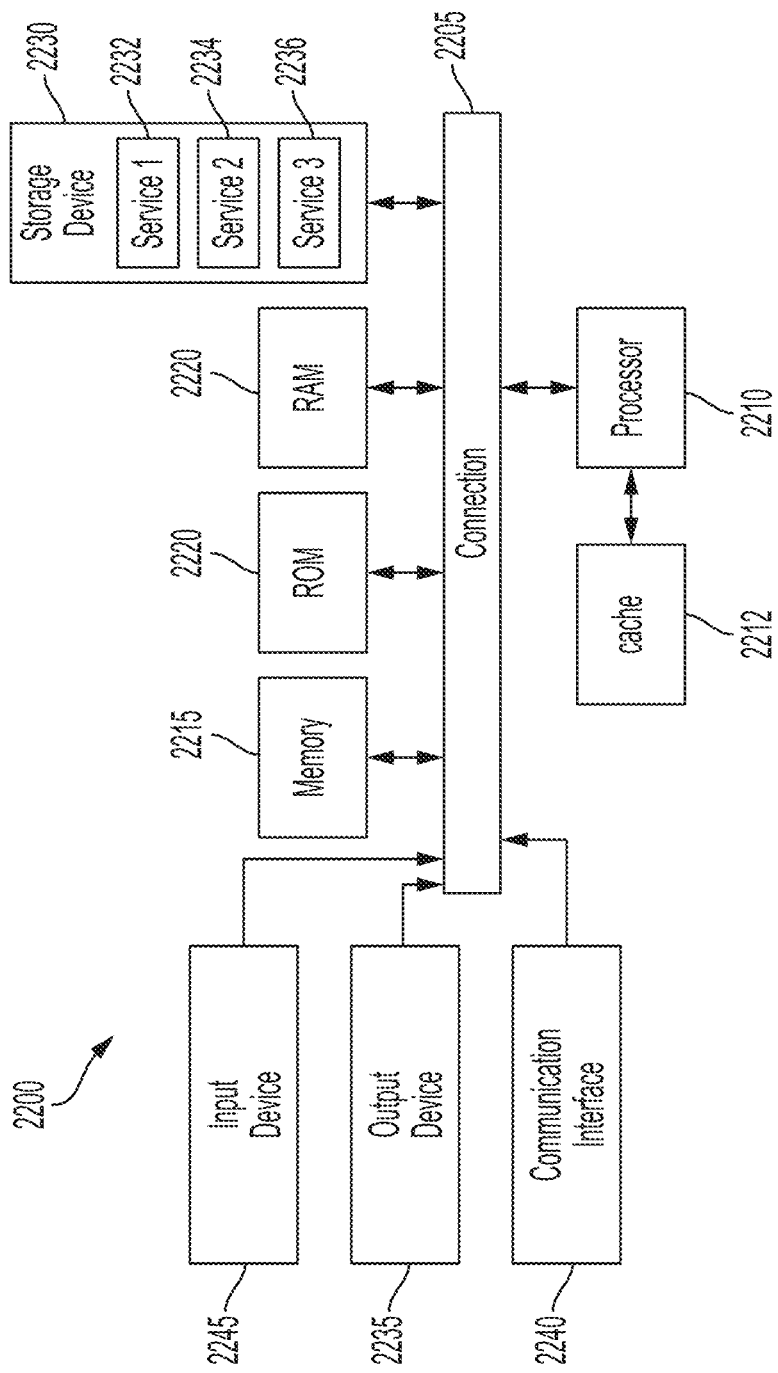
FIG. 22 shows an example of a system for implementing certain aspects of the present technology.

FIG. 22 shows an example of computing system 2200 (e.g., audio device, smart phone, etc.) in which the components of the system are in communication with each other using connection 2205. Connection 2205 can be a physical connection via a bus, or a direct connection into processor 2210, such as in a chipset architecture. Connection 2205 can also be a virtual connection, networked connection, or logical connection.

In some embodiments computing system 2200 is a distributed system in which the functions described in this disclosure can be distributed within a datacenter, multiple datacenters, a peer network, etc. In some embodiments, one or more of the described system components represents many such components each performing some or all of the function for which the component is described. In some embodiments, the components can be physical or virtual devices.

Example system 2200 includes at least one processing unit (CPU or processor) 2210 and connection 2205 that couples various system components including system memory 2215, such as read only memory (ROM) and random access memory (RAM) to processor 2210. Computing system 2200 can include a cache of high-speed memory connected directly with, in close proximity to, or integrated as part of processor 2210.

Processor 2210 can include any general purpose processor and a hardware service or software service, such as services 2232, 2234, and 2236 stored in storage device 2230, configured to control processor 2210 as well as a special-purpose processor where software instructions are incorporated into the actual processor design. Processor 2210 may essentially be a completely self-contained computing system, containing multiple cores or processors, a bus, memory controller, cache, etc. A multi-core processor may be symmetric or asymmetric.

To enable user interaction, computing system 2200 includes an input device 2245, which can represent any number of input mechanisms, such as a microphone for speech, a touch-sensitive screen for gesture or graphical input, keyboard, mouse, motion input, speech, etc. In some examples, the input device can also include audio signals, such as through an audio jack or the like. Computing system 2200 can also include output device 2235, which can be one or more of a number of output mechanisms known to those of skill in the art. In some instances, multimodal systems can enable a user to provide multiple types of input/output to communicate with computing system 2200. Computing system 2200 can include communications interface 2240, which can generally govern and manage the user input and system output. In some examples, communication interface 2240 can be configured to receive one or more audio signals via one or more networks (e.g., Bluetooth, Internet, etc.). There is no restriction on operating on any particular hardware arrangement and therefore the basic features here may easily be substituted for improved hardware or firmware arrangements as they are developed.

Storage device 2230 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 2230 can include software services, servers, services, etc., that when the code that defines such software is executed by the processor 2210, it causes the system to perform a function. In some embodiments, a hardware service that performs a particular function can include the software component stored in a computer-readable medium in connection with the necessary hardware components, such as processor 2210, connection 2205, output device 2235, etc., to carry out the function.

For clarity of explanation, in some instances the present technology may be presented as including individual functional blocks including functional blocks comprising devices, device components, steps or routines in a method embodied in software, or combinations of hardware and software.

The presented technology offers a novel way of encoding an audio file, as well as parameterizing a multiband dynamics processor, using custom psychoacoustic models. It is to be understood that the present invention contemplates numerous variations, options, and alternatives. The present invention is not to be limited to the specific embodiments and examples set forth herein.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

The presented technology offers a novel way of encoding an audio file, as well as parameterizing a multiband dynamics processor, using custom psychoacoustic models. It is to be understood that the present invention contemplates numerous variations, options, and alternatives. The present invention is not to be limited to the specific embodiments and examples set forth herein.

The invention claimed is:

1. A method for processing an audio signal based on a processing function, the method comprising:
   determining, at a processor, at least one parameter of the processing function based on an optimization of perceptually relevant information for the audio signal, wherein the processing function operates on subbands of the audio signal and the at least one parameter;
   selecting a subset of adjacent subbands;
   tying corresponding values of the at least one parameter for the selected subset of adjacent subbands;
   performing a joint determination of the tied corresponding values by minimizing perceptually relevant information for the selected subset of adjacent subbands
   parameterizing the processing function with the at least one parameter; and
   processing the audio signal by applying the processing function, wherein calculation of the perceptually relevant information for the audio signal is based on a hearing profile comprising masking thresholds and hearing thresholds.

2. The method according to claim 1, wherein the hearing profile is derived from at least one of a suprathreshold test, a psychophysical tuning curve, a threshold test and an audiogram.

3. The method according to claim 1, wherein the hearing profile is estimated from demographic information.

4. The method according to claim 1, wherein optimization of perceptually relevant information for the audio signal is further based on an ambient noise signal or is constrained by at least one of spectral coloration and distortion.

5. The method according to claim 1, wherein the determining of the at least one parameter comprises a sequential determination of subsets of the at least one parameter, each subset determined so as to optimize the perceptually relevant information for the audio signal.

6. The method according to claim 1, wherein the processing function is an equalization processing function.

7. The method according to claim 1, wherein the processing function operates on subband signals of the audio signal.

8. The method according to claim 7, further comprising:
   selecting a subset of the subbands so that a masking interaction between the selected subset of the subbands is minimized; and
   determining at least one parameter for the selected subset of the subbands.

9. The method according to claim 8, further comprising determining at least one parameter for an unselected subband based on at least one parameter of adjacent subbands, wherein the at least one parameter for the unselected subband is determined based on an interpolation of the at least one parameter of the adjacent subbands.

10. The method according to claim 7, wherein the at least one parameter is determined sequentially for each subband of the subband signals of the audio signal.

11. The method according claim 7, wherein the audio processing function is a multiband compression of the audio signal and the at least one parameter of the processing function comprises at least one of a threshold, a ratio, and a gain.

12. The method according to claim 1, further comprising:
   selecting a reduced subset of adjacent subbands from the selected subset of adjacent subbands;
   tying corresponding values of at least one parameter for the reduced subset of subbands;
   performing a joint determination of the tied corresponding values by optimizing the perceptually relevant information for the reduced subset of subbands;
   repeating the previous steps until a single subband is selected; and
   determining at least one parameter of the single subband.

13. The method according to claim 12, further comprising:
   selecting another subset of adjacent subbands;
   repeating the previous steps of determining at least one parameter of another single subband by successively reducing the selected another subset of adjacent subbands; and
   jointly processing of the at least one parameter determined for the another single subband derived from the subset of adjacent subbands and the another single subband derived from the another subset.

14. The method according to claim 13, wherein the jointly processing of the at least one parameter for the another single subbands comprises at least one of:

jointly optimizing of the at least one parameter for the another single subbands;
smoothing of the at least one parameter for the another single subbands; and
applying constraints on a deviation of corresponding values of the at least one parameter for the another single subbands.

15. The method according to claim 1, further comprising:
splitting a sample of the audio signal into frequency components;
obtaining the masking thresholds from the hearing profile;
obtaining the hearing thresholds from the hearing profile;
applying the masking and hearing thresholds to the frequency components of the sample of the audio signal and disregarding imperceptible data of the audio signal;
quantizing the sample of the audio signal; and
encoding the sample of the audio signal.

16. The method according to claim 15, further comprising:
applying different weightings to perceptual entropy contributions from different frequency regions before summing to an overall perceptual entropy measure.

17. The method according to claim 1, wherein the perceptually relevant information is calculated by one or more of perceptual entropy and specific loudness.

18. An audio processing device comprising:
a processor; and
a memory storing instructions which when executed by the processor causes the processor to:
determine one or more parameters of a processing function for operating on subbands of an audio signal, wherein:
the determination is based on an optimization of perceptually relevant information for the audio signal; and
at least one of the one or more parameters is determined for a selected subset of the subbands having a minimized masking interaction;
determine at least one parameter for an unselected subband based on an interpolation of at least one parameter of adjacent subbands;
parameterize the processing function with the one or more parameters; and
process the audio signal by applying the processing function, wherein calculation of the perceptually relevant information for the audio signal is based on a hearing profile comprising masking thresholds and hearing thresholds.

19. A non-transitory computer readable storage medium storing instructions which when executed by a processor of an audio processing device, causes the processor to:
determine one or more parameters of a processing function for operating on subbands of an audio signal, wherein:
the determination is based on an optimization of perceptually relevant information for the audio signal; and
at least one of the one or more parameters is determined for a selected subset of the subbands having a minimized masking interaction;
determine at least one parameter for an unselected subband based on an interpolation of at least one parameter of adjacent subbands;
parameterize the processing function with the one or more parameters; and
process the audio signal by applying the processing function, wherein calculation of the perceptually relevant information for the audio signal is based on a hearing profile comprising masking thresholds and hearing thresholds.

* * * * *